US008540899B2

(12) United States Patent
Miller

(10) Patent No.: US 8,540,899 B2
(45) Date of Patent: Sep. 24, 2013

(54) LIQUID COMPOSITE COMPOSITIONS USING NON-VOLATILE LIQUIDS AND NANOPARTICLES AND USES THEREOF

(75) Inventor: Seth A. Miller, Englewood, CO (US)

(73) Assignee: eSionic ES, Inc., Menlo Park, CA (US)

(*) Notice: Subject to any disclaimer, the term of this patent is extended or adjusted under 35 U.S.C. 154(b) by 491 days.

(21) Appl. No.: 12/027,924

(22) Filed: Feb. 7, 2008

(65) Prior Publication Data
US 2008/0209876 A1  Sep. 4, 2008

Related U.S. Application Data

(60) Provisional application No. 60/888,632, filed on Feb. 7, 2007.

(51) Int. Cl.
*H01B 1/24* (2006.01)
(52) U.S. Cl.
USPC .......................................... 252/500; 252/364
(58) Field of Classification Search
USPC ................................................ 252/500, 364
See application file for complete search history.

(56) References Cited

U.S. PATENT DOCUMENTS

| | | | |
|---|---|---|---|
| 3,923,426 A | 12/1975 | Theeuwes | |
| 4,115,514 A | 9/1978 | Ward | |
| 5,407,467 A | 4/1995 | Lokhandwala | |
| 5,670,051 A | 9/1997 | Pinnau | |
| 5,827,602 A | 10/1998 | Koch | |
| 5,965,054 A | 10/1999 | Mcewen | |
| 5,965,299 A | 10/1999 | Khan | |
| 6,406,605 B1 | 6/2002 | Moles | |
| 6,579,343 B2 | 6/2003 | Brennecke | |
| 6,900,382 B2 | 5/2005 | Chittibabu | |
| 7,129,005 B2 | 10/2006 | Wensley | |
| 7,521,394 B2* | 4/2009 | Xie et al. ...................... | 502/350 |
| 7,695,648 B2* | 4/2010 | Winscom et al. ............. | 252/512 |
| 2003/0109056 A1 | 6/2003 | Vossmeyer et al. | |
| 2005/0072462 A1 | 4/2005 | Kang et al. | |
| 2005/0270820 A1 | 12/2005 | Mobley et al. | |
| 2008/0006322 A1* | 1/2008 | Wang et al. ................... | 136/252 |
| 2008/0115831 A1* | 5/2008 | Kang et al. .................... | 136/263 |

FOREIGN PATENT DOCUMENTS

| | | |
|---|---|---|
| EP | 1923896 A | 2/2008 |
| WO | WO 2004097871 A2 * | 11/2004 |

OTHER PUBLICATIONS

Abu Bin Hasan Susan et al."Ion gels prepared by in situ radical polymerization of vinyl monomers in an ionic liquid and their characterization as polymer electrolytes", *Journal of the American Chemical Society* 127 (2005) 4976-4983.
Allen, et al. "Stability of Colloidal Silica" *Inst. of Colloid and Surface Science and Dept. of Chem., Clarkson College of Tech.* (1969) 287-296.
Allen, et al. "Stability of Colloidal Silica" *Inst. of Colloid and Surface Science and Dept. of Chem., Clarkson College of Tech.* (1970) 420-429.
De La Rue, et al. "On the conductivity of dispersions", *Journal of the Electrochemical Society* 106 (1959) 827-833.
Fukushima, et al. "Molecular Ordering of Organic Molten Salts Triggered by Single-Walled Carbon Nanotubes" *Science* (2003) 300:2072-2074.
Fuller, et al."Ionic liquid-polymer gel electrolytes", *Journal of the Electrochemical Society* 144 (1997) L67-L70.
Kato, et al. "Quasi-Solid Dye-Sensitized Solar Cells Containing Nanoparticles Modified with Ionic Liquid-Type Molecules" (2006) 153 (3) A626-A630.
Kosmulski, et al. Low-temperature ionic liquids immobilized in porous alumina *Journal of Colloid and Interface Science* 291 (2005) 214-217.
Li et al., "Crosslinkable fumed silica-based nanocomposite electrolytes for rechargeable lithium batteries", *Journal of Power Sources* 161 (2006) 1288-1296.
Murai, "Quasi-solid dye sensitized solar cells filled with phase-separated chemically cross-linked ionic gels", *Chemical Communications* (2003) 1534-1535.
Nakashima, et al. "Quantom dots-ionic liquid hybrids: efficient extraction of cationic CdTe nanocrystals into an ionic liquid" *Chem. Commun.* (2005) 1643-1645.
Neouze, et al. "A route to heat resistant solid membranes with performances of liquid electrolytes", *Chemical Communications* (2005) 1082-1084.
Neouze, et al. "Versatile heat resistant solid electrolytes with perfoimances of liquid electrolytes", *Progress in Solid State Chemistry* 33 (2005) 217-222.
Shimano, "Preparation of nanohybrid solid-state electrolytes with liquidlike mobilities by solidifying ionic liquids with silica particles" *Chemistry of Materials* 19 (2007) 5216-5221.
Stathatos, et al, "A quasi-solid-state dye-sensitized solar cell based on a sol-gel nanocomposite electrolyte containing ionic liquid", *Chemistry of Materials* 15 (2003) 1825-1829.
Usui, et al. "Improved dye-sensitized solar cells using ionic nanocomposite gel electrolytes", *Journal of Photochemistry and Photobiology* A 164 (2004) 97-101.
Walls et al., "Fumed silica-based composite polymer electrolytes: synthesis, rheology, and electrochemistry" *Journal of Power Sources* 89 (2000) 156-162.
Walls, et al. "Composite electrolytes from self-assembled colloidal networks", *Electrochimica Acta* 48 (2003) 2071-2077.
Walls, et al. "Ion Transport in silica nanocomposite electrolytes", *Journal of the Electrochemical Society*, 105 (2003) E165-E174.
Wang, et al "Solidifying liquid electrolyte with fluorine polymer and silica nanoparticles for quasi-solid dye-sensitized solar cells", *Journal of Fluorine Chemistry* 125 (2004) p. 1241-1245.
Wang, et al. "A new electro-osmotic pump based on silica monoliths" *Sensors and Actuators* B 113 (2006) 500-509.
Wang, et al., "Gelation of Ionic Liquid-Based Electroylytes with Silica Nanoparticles for Quasi-Solid State Dye-Sensitized Solar Cells" *J. Am. Chem Soc.* (2003) 125: 1166-1167.
Yanagida, Shozo "Recent research progress of dye-sensitized solar cells in Japan", *Comptes Rendus Chimie* 9 (2006) 597-604.

(Continued)

Primary Examiner — Douglas McGinty
(74) Attorney, Agent, or Firm — Nixon Peabody LLP

(57) ABSTRACT

A solvent composition comprising an organic solvent; dispersed nanoparticles; and a non-volatile electrolyte.

15 Claims, 4 Drawing Sheets

(56) References Cited

OTHER PUBLICATIONS

Zhang et al.,"Inhibition of lithium dendrites by fumed silica-based composite electrolytes" *Journal of the Electrochemical Society* 151 (2004) AI257-AI263.

Xiong et al., "Liquid Polymer Nancomposites PEGME-SnO2 and PEGME—TiO2 Prepared through Solvothermal Methods" *Chem Mater.* 18 (2006) 3850-3854.

Jacob et al. "From nanocomposite to nanogel polymer electrolytes" *J. Mater. Chem* (2003) 13 1-5.

Liu et al. "Nano-Ti02-coated polymer electrolyte membranes for direct methanol fuel cells" *Journal of Power Sources*, vol. 157, No. 1, (2006) pp. 207-211.

Liu, Z., et al., "Nano-TiO2-Coated Polymer Electrolyte Membranes for Direct Methanol Fuel Cells," Journal of Power Sources, Elsevier, Amsterdam, NL, vol. 157, No. 1, Jun. 19, 2006, pp. 207-211.

International Preliminary Report on Patentability for PCT/US2008/053333 dated Aug. 20, 2009.

\* cited by examiner

Figure 1: TGA, 400 minute hold, at 200, 225, and 250C for the composite material, and at 250 C for EMI-IM ionic liquid. The initial weight loss for the composite material is residual solvent, and is not counted as part of the total weight lost by the material during the heating period.

Figure 2 AFM of a spun-cast film of silica nanoparticle and EMI-Im from PGMEA

LIQUID COMPOSITE COMPOSITIONS USING NON-VOLATILE LIQUIDS AND NANOPARTICLES AND USES THEREOF

This application claims benefit under 35 U.S.C. §119(e) to U.S. Application No. 60/888,632, filed Feb. 7, 2007, which is here by incorporated by reference in its entirety.

FIELD OF THE INVENTION

The invention relates generally to the field of gelled liquid compositions for use in a variety of applications ranging from use as electrolytes in electronic memory, supercapacitors, battery electrolytes, embedded energy storage, fuel cell membranes, low-k or high-k dielectrics, membranes, electrochromic devices, dye sensitive solar cells, anti-static coatings and other coatings, and a variety of materials improvements, all of which are further outlined below. The compositions of the invention comprise mixtures of nanoparticles, optionally polymers and non-volatile liquids (including ionic liquids and other electrolytes), in a variety of mixtures, and materials and devices that can be made from such composites.

BACKGROUND OF THE INVENTION

A gel consists of a liquid phase that is held together by a continuous solid network. A unique and desirable property of a gel is that molecules in the liquid phase are free to diffuse throughout the bulk of the gel, but the liquid itself is geometrically constrained. As a result, gels have been used in applications where high molecule mobility is desirable, but it is advantageous to confine the liquid without having to surround it completely with walls, such as in chemical separation materials or battery electrolytes.

The continuous solid network that constrains the gels can be made using a number of classes of materials, including: agglomerated particles, fibers, or plates; polymers joined by small crystalline regions; polymers linked by covalent bonds; and polymers linked by non-covalent bonds, such as hydrogen bonds or coordination compounds.

Typically, the solid network occupies less than 10% of the volume of the gel. At higher solids loading, liquid can no longer diffuse independently from the solid, and diffusivity can decrease dramatically. This shortcoming is particularly acute for systems gelled by polymers, where the mixing between the liquid and the solid occurs on the molecular level. In order to obtain good diffusivity, the gels tend to be lightly loaded with solids and mechanically quite weak.

Gels made using inorganic materials as the solid component can generally have improved mechanical properties relative to those using polymers as the gelling agent. This can arise in part from the geometry of the dispersed solid: a rigid inorganic fiber or rod, spanning microns through a liquid, can bear a larger load than individual strands of polymer. Using sol-gel chemistry, inorganic materials can also be made that have regions of greater density (which exclude liquid), adjacent to regions of lower density (which can be predominately liquid). Continuous regions of greater density can bear a mechanical load, while regions of lesser density can allow for the transit of molecules in the liquid phase.

Sol-gel chemistry, however, can be relatively difficult to optimize and control, as the result obtained by one experiment performed at a specific temperature, solvent, salt concentration, aging protocol, etc. will not yield the same result when any of the parameters are changed. Parameters such as Young's modulus, fracture toughness, etc. can change dramatically with even changes in the thickness of the film. Furthermore, it can be difficult to guarantee a uniformity of pore size, a parameter which is critical for many applications. As a result, it would be preferred to find a gel system that has a wider process window and gives more uniform, predictable results.

Nanoparticles have been used to gel liquid systems such as aqueous sulfuric acid battery electrolyte. Typically silica particles have been used, as in U.S. Pat. No. 3,271,199, but other nanoparticles have also been applied, including organic ones as in U.S. Pat. No. 3,930,881. Generally, agglomerated particles of any type can gel a liquid, but the total particle loading of the gel is limited by the ability to homogenously mix the two components. Because the stiffness of the gel increases as the particle fraction increases, mixing often becomes difficult above a 10% particle loading, with this critical loading varying from system to system. As a result, this method has difficulty producing gelled system with sufficient stiffness to act as battery separators, as described in Li et. Al. [Y. Li, J. A. Yerian, S. A. Kahn, P. S. Fedkiw, "Crosslinkable Fumed Silica-Based Nanocomposite Electrolytes for Rechargeable Lithium Batteries", Journal of Power Sources, 161 (2006) p. 1288-1296].

In all cases, what is desired is a two phase system, where a solid phase serves as a porous mechanical support, and a second, liquid phase can flow freely through the pores. Such a system would be maximally useful if the two phases are separated on the nano-scale, as this would enable the material to appear homogenous on applied length scales.

A liquid system that has been gelled by a compatible polymer is essentially a single phase, and the resulting material exhibits neither the high diffusivity of the parent liquid nor the mechanical properties of the parent polymer. However, if the liquid and polymer are not compatible, the two materials will phase separate. Thus, for the vast majority of polymers and liquids, it is not possible to come up with a system with the desired attributes of good materials properties and good liquid diffusivity.

One example of a system with some success in this endeavor was demonstrated by Gin et al [Gin, D. L.; Gu, W.; Pindzola, B. A.; Zhou, W.-J. "Polymerized Lyotropic Liquid Crystal Assemblies for Materials Applications," Acc. Chem. Res. 2001, 34, 973-980], where nanochannels of water are supported by a polymerized liquid crystal scaffolding. In this system, the liquid crystalline order is needed to keep the solid phase intermingled with the liquid phase on the nanoscale. The drawback of this approach is that, so far, these materials must be processed in carefully controlled conditions to preserve the liquid crystalline order, thus limiting its utility as a technology.

Two fields that would benefit most from a mechanically stable gelled liquid are: gelled electrolytes, for instance for batteries, supercapacitors, or electrochemical sensors; and constrained liquid membranes, for gas separations.

SUMMARY OF THE INVENTION

In one aspect, the invention provides solvent compositions comprising a solvent, dispersed nanoparticles and a non-volatile liquid. The solvent composition can optionally comprise monomers, polymers and cross-linking agents. In an additional aspect, the solvent may be an organic solvent, and it is optionally polar. In a further aspect, the liquid may be an ionic liquid (IL), or a non-volatile liquid containing dissolved salts. In one aspect, the nanoparticle liquid composite compositions comprise at least about 20 wt % of nanoparticles.

In a further aspect, the nanoparticles have a surface that prevents aggregation in the presence of the non-volatile liquid, for example the surface may be acidic, e.g. the nanoparticles comprise acidic silicon dioxide.

In a further aspect, the nanoparticles are less about 100 nm in diameter; alternative aspects include nanoparticles that are less than about 25 nm in diameter.

In an additional aspect, the nanoparticles are nanorods, where their cross-sectional diameter is less than about 100 nm or less than about 20 nm.

In a further aspect, the nanoparticles can be more than one type, e.g. nanospheres and nanorods.

In a further aspect, the nanoparticles comprise a core and a shell. Optionally, the shell comprises silicon dioxide. Similarly optionally, the core is a composite of more than one material.

In an additional aspect, the ionic liquid comprises more than one cation and/or anion. Optionally, the cation of the ionic liquid is a Bronsted acid.

In a further aspect, the ionic liquid is a eutectic that is a liquid at less than 100 C.

In a further aspect, the liquid composite compositions of the invention further comprise additional agents, such as polymers, and can also include reactive agents such as crosslinking agents, drying agents, dyes, biological molecules including proteins, lipids, nucleic acids and carbohydrates.

In an additional aspect, a component of said ionic liquid is polymerizable.

In a further aspect, the invention provides methods of forming a liquid composite compositions (for example, an electrolyte composition) comprising providing a solvent composition as outlined above, applying the solvent composition to a substrate and removing the solvent to form the liquid composite composition. In one aspect, the removing is done simultaneously with or after the applying. In some aspects the applying is done by spin coating. Optionally, the substrate can be heated.

In an additional aspect, the invention provides devices comprising the liquid composite compositions outlined herein, particularly as electrolyte compositions.

In a further aspect, the devices have electrolyte compositions that have a Young's modulus of at least about 10 megapascals.

In an additional aspect, the device comprises an array of cells, each cell comprising a first electrode, an electrolyte composition as outlined herein, and a second electrode. The electrolyte composition is electrically coupled to at least one of the first and second electrodes. The device can be a battery, a capacitor, a dye-sensitized solar cell, a semiconductor memory cell (in some aspects, the semiconductor memory cell comprises a molecular memory cell).

In an additional aspect, the invention provides methods comprising providing a Icc (particularly electrolyte compositions) as outlined herein and depositing a material on to the Icc. The Icc is optionally on a substrate. The substrate material may be a conductive material, an insulator, or other forms of supports.

In a further aspect, the invention provides materials comprising nanoparticles and a non-volatile electrolyte, where the nanoparticles comprise more the 20% of the volume of the material, with more than 25%, 30%, 40% or 50% being optional. The material can be included in a device.

In an additional aspect, the invention provides materials and devices comprising nanoparticles and a non-volatile electrolyte, where the modulus of the material is above 100 MPa, above 200, 300, 400, 500, 600, 700 800, 900 MPa or 1 GPa.

In a further aspect, the invention provides materials and devices comprising the Iccs of the invention wherein the conductivity of the material is at least 10% of the conductivity of the neat electrolyte. In some embodiments, the diffusivity of the liquid component of the material is at least 10% of the diffusivity of the pure liquid.

In an additional aspect, the invention provides materials and devices comprising a non-volatile liquid, a reactive species, and a support material, wherein an external stimulus is applied to cause a chemical transformation in the reactive species, wherein the reactive species is miscible with the non-volatile liquid before reaction, and the transformed reactive species is no longer miscible with the non-volatile liquid after the reaction. The support material (sometimes referred to as a "gelling agent") can be nanoparticles or polymers.

In a further aspect, the invention provides membranes comprising non-volatile liquids and nanoparticles. These can include gas-separation membranes comprising a support membrane and a Icc of the invention. Additionally, these can include electrochemical gas sensors comprising a working electrode, a counter electrode; and a liquid composite composition comprising nanoparticles and a non-volatile liquid.

The invention also provides a number of materials, including anti-static coatings comprising a liquid composite composition comprising a non-volatile electrolyte and nanoparticles; batteries comprising a liquid composite composition comprising non-volatile electrolyte and nanoparticles; dye-sensitized solar cells comprising a liquid composite composition comprising a non-volatile liquid and nanoparticles and capacitors comprising a liquid composite composition comprising a non-volatile liquid and nanoparticles.

DETAILED DESCRIPTION OF THE INVENTION

Figure 1:
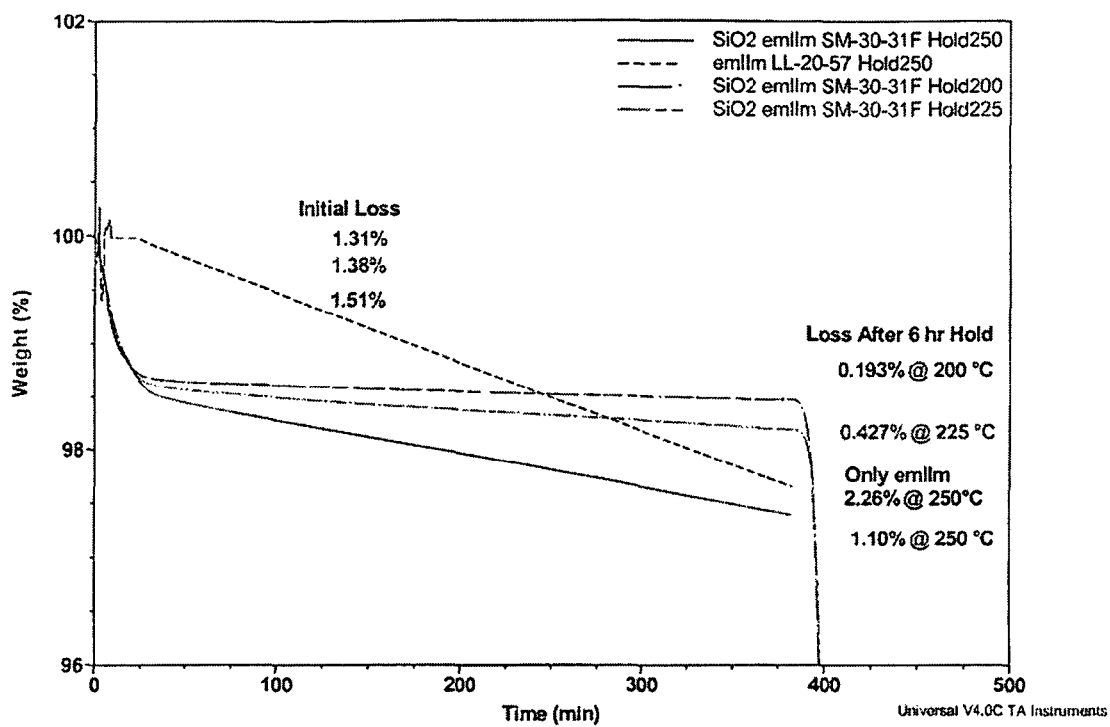
FIG. 1: TGA, 400 minute hold, at 200, 225, and 250 C for the composite material, and at 250 C for EMI-IM ionic liquid. The initial weight loss for the composite material is residual solvent, and is not counted as part of the total weight lost by the material during the heating period.

The present invention is directed to the formation of compositions, generally referred to herein as "liquid composite compositions", which comprise at least two components, including a non-volatile liquid and a support material. The compositions can include other components, such as a solvent for application of the material, followed by removal of the solvent to form the compositions of the invention. The support material can be a variety of materials as outlined herein, with nanoparticles and/or polymers (and combinations thereof) finding particular use. The resulting liquid composite compositions, and derivative materials, find use in a wide variety of applications.

In general, the liquid composite compositions of the invention comprise nanoparticles as the support material, these can also be referred to as "nanoparticle liquid composite compositions" or "nanoparticle composite compositions". In some embodimenta, the compositions can optionally comprise a polymer. In this embodiment, the non-volatile liquid (including ionic liquids) and the polymer phase separate on a scale of less than a micron when cast into a film.

Liquid Composite Compositions Comprising Nanoparticles

There are examples of nanoparticle-liquid compositions made by grinding dry nanoparticles with liquids until they are well-mixed. Because nanoparticles, in their dry state, are often clumped together to form aggregates, there is no way of assuring that the particles have dispersed to their nanoscopic state in making the final material, or of assuring that the particles are homogenously distributed. As a result, the performance of the final material can depend on the history of the nanoparticles themselves, as well as on the specifics of the mixing process, making the approach ill-suited for manufacturing. In addition, it is not possible to make thin films or many other geometries by starting with a bulk mixed solid. Finally, it is extremely difficult to make composite materials with high loadings of nanoparticles relative to non-volatile liquids by methods such as grinding or sonication. Such materials may find use as an electrolyte if, for instance, high modulus is desired alongside high ionic conductivity.

Most nanoparticles are kept in dispersion as charged particles, and it is their repulsive ionic forces that keep the particles from coalescing while in solution. (C. J. Brinker and G. W. Scherer, *Sol-Gel Science: The Physics and Chemisrty of Sol-Gel Processing*, 1990, Academic Press, Inc, San Diego, Calif.) When a salt is added to such a dispersion, the repulsive forces are screened by the free ions in solution, and the particles immediately aggregate.

Another method of stabilizing nanoparticles is to coat them with a polymer to prevent the particles from physically aggregating. In order for this to be successful, the polymer must be well-adhered to the particle, and also be compatible with the solution, so as to ensure that a polymer-solution interaction is preferred over polymer-polymer aggregation. For systems requiring additional components, such as an ionic liquid, balancing the compatibilities can be challenging.

The present invention has solved many of these issues and provides the ability to make compositions that do not comprise aggregated nanoparticles (e.g. where the nanoparticles are substantially homogeneously dispersed in the composition) and thus provide highly reproducible and easily manufacturable compositions. Thus, the present invention provides compositions that include nanoparticles with an appropriate surface, including but not limited to an acidic silica surface, that are prepared in a dispersion in a solvent that also contains non-volatile liquid(s), and from which dispersion the solvent can subsequently be removed to reveal a substantially homogenous nanoparticle-liquid composite material, referred to generally herein as a "liquid composite composition" or as a "nanoparticle liquid composite composition". As outlined below, the nanoparticle liquid composite composition can additionally include additional components, such as monomer-polymer components. The dispersion comprising the solvent, the nanoparticles and the non-volatile liquid is generally referred to herein as a "solvent composition".

The resulting composite materials can be formulated to have a dense, substantially homogenous distribution of nanoparticles in an organic matrix. This dense composite itself can serve as the precursor to other materials by transforming all or part of the liquid matrix.

For example, chemicals that react when exposed to an external stimulus (such as heat or light) can be added to the system, allowing its properties to be modified after the solvent is removed (or during, as the case may be). In a preferred embodiment, two liquids are used, one which is polymerizable, and another which is unreactive. On polymerization, the first liquid will tend to phase separate from the second, but will be constrained to do so on the nano-scale by the presence of the nanoparticles. As a result, a nanoparticle-polymer-liquid composite can be created with excellent mechanical properties and good liquid diffusivity.

The liquid can also be chosen from the subset of polymerizable liquids, and a suitable initiator can be added, allowing the system to be transformed into a polymer/nanoparticle composite with a variety of applications, for example as fuel cell membranes.

In addition, the liquid can be removed, by decomposition or extraction, revealing a nanoporous matrix of fused nanoparticles, which can be used, for example, as a low-k dielectric film, or as a chemoselective membrane. It is also possible to polymerize the liquid component, as described above, and then etch out the nanoparticles, leaving the polymer matrix in place; again, this may be with cross-linked or other modified polymer matrices as well. Such a material may be similarly used, for example, as a membrane, low-k dielectric film, or low refractive index film.

Accordingly, the present invention provides liquid composite compositions comprising nanoparticles and non-volatile liquids.

Nanoparticles

The present invention provides liquid composite compositions that comprise nanoparticles. By "nanoparticles" herein is meant particles having a range in size from about 5-10 nm to about 100 nm, although as described below, this generally is the smallest cross section; for example, elongated particles such as nanorods or nanotubes can have diameters of 10-20 nm but much longer lengths such as 300+ nm. In this context, the prefix "nano", which generally refers to objects less than 100 nm, is not meant to be limiting, as in some cases "nanoparticles" of greater than 100 nm at the smallest cross section can find use in the invention. As will be appreciated by those in the art, the size of the nanoparticle can also depend on the desired thickness of the ultimate electrolyte composition. For example, for making coatings of <1 micron, particles of less than about 100 nm find particular use. Similarly, for bulk applications, particles of sizes greater than 100 nm can find use.

"Nanoparticles", as used herein, need not be spherical; thus, for example, included within the definition of "nanoparticles" are particles with a variety of cross sections, including rods (e.g. "nanorods", which includes "nanotubes"), as well as a variety of other shapes, both regular and irregular; for example, diamonoids come in a wide variety of shapes.

In one embodiment, the nanoparticles are of uniform composition. For example, nanoparticles comprising amorphous silicon dioxide find particular use in the present invention. Similarly, any type of colloidal metal or metal oxide with the appropriate surface properties can be used, including, but not limited to, gold, titanium dioxide, etc.

In another embodiment, the nanoparticles have a core and a shell, or external coating. In this embodiment, the core and the shell are different materials, and may be chosen for their intended use, as long as the nanoparticles will disperse in solvent in the presence of an ionic liquid. Because acidic silicon dioxide surfaces are known to be compatible with ionic liquids, nanoparticles with silicon dioxide shells find particular use in some embodiments.

In addition, in some embodiments more than one type of nanoparticle is used in the compositions of the invention. For example, nanoparticles of similar composition (e.g. silicon dioxide) but different shape can be used (e.g. spherical nanoparticles and nanorods). Alternatively, nanoparticles of different compositions can be used, e.g. silicon dioxide and carbon, and optionally of different shapes.

Of particular use in some embodiments are silicon dioxide nanoparticles sold under the tradename "ORGANOSILICA-SOL" by Nissan Chemical Corporation, including IPA-ST-S (3-5 nm), MT-ST (10-15 nm), MA-ST-MS (17-23 nm), IPA-ST (10-15 nm), IPA-ST-MS (17-23 nm), IPA-ST-L (40-50 nm), IPA-ST-ZL (70-100 nm), IPA-ST-UP (9-15 nm, elongated; lengths of 40-300 nm), EG-ST (10-15 nm); NPC-ST-30 (10-15 nm); MEK-ST (10-15 nm), MEK-ST-MS (17-23 nm), MIBK-ST (10-15 nm), PMA-ST (10-15 nm) and DMAC-ST (10-15 nm).

In one embodiment, the nanoparticle can be a "nanocrystal" or "quantum dot". By "nanocrystal", "quantum dot" or "semiconductor cluster" herein is meant a particle less than about 30 nm that displays luminescence. For the purposes of the present invention, the luminescence may or may not be important.

In nanocrystals, the absorbance onset and emission maximum shift to higher energy with decreasing size. The excitation tracks the absorbance, resulting in a tunable fluorophore that that can be excited efficiently at any wavelength shorter than the emission peak yet will emit with the same characteristic narrow, symmetric spectrum regardless of the excitation wavelength. Variation of the material used for the nanocrystal and variation of the size of the nanocrystal afford a spectral range of at least 400 nm to 2 μm in the peak emission, with typical emission widths of 20 to 30 nm at room temperature (full width at half maximum (FWHM)) in the visible region of the spectrum and large extinction coefficients in the visible and ultraviolet range (approximately 105 $M^{-1}$ $cm^{-1}$). Narrower emission widths may be obtained at lower temperatures.

Metallic and magnetic nanocrystals, with the appropriate organic derivatization of the surface, have been previously described. See, e.g., Bruchez, supra, Chan and Nie, supra, Miltenyi, et al., Cytometry, 11:231 (1990); Lackle, Histochem. Cell Biol., 106:9 (1996); Hermann, et al., Histochem. Cell Biol., 106:31 (1996); Elghanlan, et al., Science, 277: 1078 (1997); Alivisatos, et al., Nature, 382:609 (1996); Mirkin, et al., Nature, 382:607 (1996); and Beverloo, et al., Cytometry, 11:784 (1990), all of which are incorporated by reference in their entirety. Preferred materials include, but are not limited to, CdSe, InP, InAs, GaAs and CdS.

Bandgap engineering concepts borrowed from materials science and electronics have led to the development of core-shell nanocrystals. By enclosing a core nanocrystal of one material with a shell of another having a larger bandgap, one can efficiently confine the excitation to the core, eliminating nonradiative relaxation pathways and preventing photochemical degradation. Thus, in a preferred embodiment, the nanocrystals comprise a core and a shell. For example, preferred embodiments include a CdSe core and a AnS or CdS shell. Other examples use CdS/HgS/CdS, InAs/GaAs, GaAs/AlGaAs and CdSe/ZnS.

Additionally, in the most preferred embodiment, the nanocrystals are coated for increased solubility of the crystals. Preferably, the coating is of silica, or silicon dioxide, although as will be appreciated, a wide variety of coatings may be utilized. Moreover, the nanocrystals can comprise mercaptoacetic acid for solubilization if required. When reacted with ZnS-capped CdSe nanocrystals in chloroform, the mercapto group binds to a Zn atom, and the polar carboxylic acid group renders the nanocrystal water soluble. Other reagents which produce similar results can also be used.

Other types of nanoparticles which find use in the present invention include, but are not limited to, metal colloids, fullerenes, nanoparticles comprising dendrimers (for example, PAMAM DAB cores with different potential surfaces, including amines, PEG, succiminic acid, etc.), polymer nanoparticles (including but not limited to polymers as outlined herein and specifically polystyrene particles), resins, ceramics, mica, other silica or silica-based materials in addition to those mentioned, carbon, metals, inorganic glasses, and a variety of other polymers.

In some embodiments, the nanoparticles are metal colloids (including, but not limited to silver, gold, copper, platinum, palladium, iridium, titanium, zinc, iron, nickel, and surface treated derivatives thereof). Thus, for example, gold colloids (commercially available in a wide variety of sizes) may be derivatized with thiol moieties containing additional functionalities, such as charge.

In some embodiments, the nanoparticles have an acidic surface. In this context, this means that the nanoparticles, when in water, impart to the water a pH below 7, with pHs of from about 2 to about 4 and from about 3 to about 5 finding use in particular embodiments. In general, as is true for nanoparticles of the invention, silica nanoparticles with acidic surfaces that find use in the invention will not significantly aggregate when salt (for example in the form of an ionic liquid) is added.

In general, the composition of the nanoparticles, including their surface characteristics, are such that the nanoparticles can be significantly dispersed in non-volatile liquids without aggregation. As will be appreciated by those in the art, this is easily determined visually. That is, solutions of nanoparticles of less than about 100 nm in size are generally optically clear; upon aggregation, a cloudiness or flocculation is seen. Thus, to test the compatibility of the ionic liquids, solvent and nanoparticles for use in the invention, they are added together as discussed below and checked for nanoparticle aggregation. In some cases, solutions of larger nanoparticles (e.g. nanorods) in solvents may already be visually cloudy; non-volatile liquids are added and changes in the amount, color or density of flocculation are evaluated.

The amount of nanoparticles in the solvent compositions of the invention will vary from 5-10% by weight to about 50-80% or more, depending on the application, with from about 50-55% to about 60-65-70% by weight being preferred, although wt % s from 10, 20, 30, 40, 50, 60, 70, 80 and 90% can be used. For example, for applications where high modulus is required, from about 60% to about 70% by weight may be preferred. For nanoparticles of high density, such as ITO nanoparticles, higher weight % loadings may be preferred. In some cases the nanoparticle loading of the composition is measured in vol %, with the analogous percentages finding use in different applications.

Alternatively, commercial dispersions of nanoparticles are generally about 15-40% by weight nanoparticles (especially in the case of silicon dioxide nanoparticles as sold by Nissan Chemical Corporation), and non-volatile liquids are generally added at a 1:1 to 1:5 ratio by weight, with from about 1:2 finding use in particular applications. In some embodiments, solutions of 20-30-40% nanoparticles by weight are used, with the addition of non-volatile liquids thus diluting out the resulting solvent composition. As is outlined herein, ratios of 3:6:14 (non-volatile liquid:nanoparticles:solvent) can find particular use. For applications such as spin-coating, it may be preferred to further dilute such a composition to achieve a desired coating thickness.

In some embodiments, there may be benefit to using a non-volatile liquid (described below) that has a similar refractive index to the nanoparticles. Such index-matching is likely to give a transparent or translucent film. Matching the refractive index is a good proxy for matching the Hammaker constant as well, and this can provide some stability to the nanoparticle-liquid composite. In particular, nanoparticle dispersions are stabilized by ionic repulsion, and in the absence of ionic repulsion it is van der Waals forces that drive the ions together. Materials of matched Hammaker constants will have similar van der Waals forces, and as a result these forces will not be driving the separation of nanoparticles from ionic liquids (ILs) in a composite.

In some embodiments, the nanoparticles are not comprised of $TiO_2$. In some embodiments, the nanoparticles are not underivatized silica.

Non-Volatile Liquids

The present invention provides liquid composite compositions comprising non-volatile liquids. By "non-volatile liquid" herein means a liquid whose boiling point is over 200° C. at 1 atmosphere of pressure (or whose boiling point at lower pressure, corrected to one atmosphere, is over 200° C.). For many applications, it may be preferred to use a liquid whose boiling point is over 300° C. at one atmosphere (or whose boiling point at lower pressure, corrected to one atmosphere, is over 300° C.). For applications in membranes, where high gas fluxes pass through the sample, it may be preferred to use a liquid with whose boiling point at low pressure, corrected to atmosphere, is over 400° C. Some low molecular weight polymers and ionic liquids fit this last criteria.

In one embodiment, the non-volatile liquid comprises an ionic liquid. By "ionic liquid" ("IL") herein is meant a liquid that contains only ions. In the usual sense, this term includes all salts or mixed salts systems with melting points below 100 C, However, many embodiments of the invention utilize ionic liquids termed "room-temperature ionic liquids" (RTILs) that have melting points generally below room temperature. In general, ionic liquids with large organic cations find particular use in the present invention, although a wide variety of ionic liquids can be used as described herein. Similarly, ionic liquids comprising Bronsted acid cations are also useful in some embodiments. Ionic liquids with Lewis acid anions, such as the much-studied $AlCl_4$-based systems, are useful in some embodiments. Furthermore, hydrophobic ionic liquids may find use in a variety of particular applications, where, for instance, variations in the humidity to which the composite is exposed would cause unacceptable variations in its performance.

As is appreciated by those in the art, there are a wide variety of ionic liquids, and estimates range up to $10^{18}$ possible combinations of cations and anions. Cations and anions that find use in the present invention, include, but are not limited to, anions (Acetate, trifluoroacetate, dicyanamide, tetrafluoroborate; bis[oxalato(2-)]borate, bis(salicylato(2-)]borate; tricyanomethane; iodide; chloride; bromide; bis(trifluoromethylsulfonyl)imide; Bis(pentafluoroethylsulfonyl)imide; tris(pentafluoroethyl)trifluorophosphate; hexafluorophosphate; methylsulfate; ethylsulfate; octylsulfate; hydrogensulfate; trifluoromethanesulfonate; p-toluenesulfonate; Dimethylphosphate) and cations (Ethyl-dimethyl-propylammonium, Methyltrioctylammonium, Cyclohexyltrimethylammonium; 2-Hydroxyethyltrimethylammonium; Tetrabutylammonium, Tetraethylammonium; Tetramethylammonium; Guanidinium; Hexamethylguanidinium; N,N,N',N',N"-Pentamethyl-N"-propylguanidinium; N"-Ethyl-N,N,N',N'-tetramethylguanidinium; 1-Allyl-3-methylimidazolium; 1-Vinyl-3-methylimidazolium; 1,2,3-Trimethylimidazolium; 1,2-Dimethyl-3-propylimidazolium; 1,3-Dimethylimidazolium; 1-Benzyl-3-methylimidazolium; 1-Butyl-2,3-dimethylimidazolium; 1-Butyl-3-ethylimidazolium, 1-Butyl-3-methylimidazolium; 1-Decyl-3-methylimidazolium; 1-Dodecyl-3-methylimidazolium 1-Ethyl-2,3-dimethylimidazolium 1-Ethyl-3-methylimidazolium 1-Hexadecyl-2,3-dimethylimidazolium; 1-Hexyl-2,3-dimethylimidazolium; 1-Hexyl-3-methylimidazolium; 1-Methyl-1-octylpyrrolidinium; 1-Methylimidazolium; 3-Methyl-1-octadecylimidazolium; 3-Methyl-1-octylimidazolium; 3-Methyl-1-phenylpropylimidazolium; 3-Methyl-1-tetradecylimidazolium; 3-Propyl-1-methylimidazolium; O-Ethyl-N,N,N',N'-tetramethylisouronium; 1,3-Dimethylimidazolium; O-Methyl-N,N,N',N'-tetramethylisouronium; S-Ethyl-N,N,N',N'-tetramethylisothiouronium; Triethylsulfonium; Tetrabutylphosphonium; riisobutyl(methyl)phosphonium; Tetradecyl(trihexyl)phosphonium; Ethyltri(butyl)phosphonium; 4-Methyl-N-octylpyridinium; N-Methyl-3-octylpyridinium; N-Butyl-3,4-dimethylpyridinium; N-Butyl-3,5-dimethylpyridinium; N-Butyl-3-methylpyridinium; N-Butyl-4-methylpyridinium; N-Butylpyridinium; N-Ethylpyridinium; N-Hexylpyridinium; N-Octylpyridinium; N-Ethyl-3-hydroxymethylpyrridinium; 1,1-Dibutylpyrrolidinium; 1,1-Dimethylpyrrolidinium; 1-Butyl-1-methylpyrrolidinium; 1-Ethyl-1-methylpyrrolidinium; 1-Hexyl-1-methylpyrrolidinium; 1-Methyl-1-octylpyrrolidinium;

In one embodiment, the ionic liquid that is used to form the solvent and electrolyte compositions of the present invention is composed of a single cation-anion pair. In alternative embodiments, two or more ionic liquids may be used to form the compositions. In these embodiments, the percentage of each of the ionic liquids can range widely, from about equal (e.g. 50% weight percent in the case of two ionic liquids) to ratios of about 0.01:0.99, etc. It should be noted that if the cations and anions of the two liquids are entirely different, then in principle a mixture of four salts is created by the mixing of two liquids. Again, what is most important in the context of nanoparticle liquid composite compositions is that the nanoparticles do not significantly aggregate in the presence of the ionic liquid(s).

In some embodiments, the ionic liquid is formed as a eutectic from one or more ionic solids. For example, two ionic solids may form a eutectic with a melting temperature of less than about 10° C.; thus, in some embodiments, the term "ionic liquid" includes ionic liquids that are eutectics from ionic solids, or from an ionic liquid and an ionic solid.

In some embodiments of the invention, polymerizable ionic liquids can be used. For example, ionic liquids comprising vinyl imidazolium cations find use in this embodiment. In these embodiments, as is discussed below, optional crosslinking agents may be used as needed. In these embodiments, suitable crosslinking agents/polymerizable composition combinations vary widely, and include the use of chemical crosslinking agents. Suitable chemical crosslinkers include, but are not limited to, silyl esters, diisocynates, divinylbenzene, diacrylates etc. Polymerization may occur upon exposure to an external stimulus, such as via the addition of heat or light (particularly visible or UV light, e.g. when a photosensitive initiator is added); radiation, or altering the pH (e.g. by facilitating direct bonding between the silica nanoparticles). In some embodiments, no exogenous crosslinking agent is needed: for example, an imidazolium cation which has two polymerizable groups appended to it may be made into an ionic liquid and polymerized directly.

In this embodiment, as for other embodiments, the polymerizable ionic liquid can be used alone, several different polymerizable ionic liquids can be used, or one or more polymerizable ionic liquids can be used with one or more "inert" (e.g. non-polymerizable) ionic liquids. Ionic liquids can also be diluted in other non-volatile liquid, which may or may not be polymerizable.

In addition to polymerizable ionic liquids (or other non-volatile liquids), it is also desirable in some applications to optionally include monomers (and optional crosslinkers, if physical crosslinking methods such as heat or light are not used) in the solvent compositions of the invention, such that the final Iccs of the invention include polymers. Suitable monomers/polymers are discussed below.

In one embodiment, the non-volatile liquid is a non-volatile electrolyte. For example, phosphoric acid is a non-volatile electrolyte that has applications in fuel cells. A composite material of phosphoric acid and silica can be prepared and cast similarly to composite materials of ionic liquids and silica discussed herein. Similarly, other acids such as sulfuric acid can be made into free-standing liquid composite films by the methods described herein, and these can be used as electrolytes or for other applications.

In an additional embodiment, the non-volatile liquid is a low molecular weight polymer. Low molecular weight polymers are another class of liquids that can be formulated into composites by the techniques discussed. For example, poly (ethylene glycol) and poly(propylene glycol) are both available as liquids, and their alcohol end-groups can be modified to raise or lower their chemical reactivity. A composite of a poly(glycol) and silica can be prepared by the methods discussed above and below. Other oligomeric materials may be suitable as the non-volatile liquid phase in this application, including silicones, fluorocarbons (such as tetrafluoroethylene oxide), low MW polyesters, etc. These materials can be used alone or with dissolved salts, which should display ionic conductivity as long as the low MW polymer is a liquid at the temperature of operation.

In this embodiment, addition of lithium or other salts to the starting solution containing nanoparticles and poly(glycols) can also be done, resulting in a composite lithium electrolyte, with substantial lithium conductivity. Combinations of such systems, eg, ionic liquid and poly(ethylene glycol)s, with or without additional ionic solid, or poly(ethylene glycols) with non-volatile solvents such as ethylene carbonate or propylene carbonate may find utility as well.

In some embodiments, the non-volatile liquid is not a resin.

Solvents

The present invention provides compositions comprising solvent(s) comprising nanoparticles and at least one non-volatile liquid. In a preferred embodiment, the solvent(s) is (are) chosen from the class of organic solvent(s). By "organic solvent" herein is meant a solvent containing carbon. It should be noted that the term "solvent" generally refers to liquids that will dissolve solutes; however, in the present context, the nanoparticles are not dissolved, but dispersed. In some embodiments, polar organic solvents find particular use. As will be appreciated by those in the art, the number of suitable polar organic solvents is extensive, with methyl alcohol, isopropyl alcohol, methyl ethyl ketone, propylene glycol methyl ether acetate, dimethyl acetamide, and ethylene glycol mono-propyl ether, and toluene finding particular utility in some embodiments.

The choice of the solvent will depend on the choice of non-volatile liquid such as an ionic liquid and composition of the nanoparticles. In some embodiments, the choice of solvent depends on the desired method of applying the electrolyte compositions of the invention. That is, for certain applications, such as in spin coating of thinner electrolyte compositions, solvents with boiling points in the mid 100 C range are chosen. Alternatively, a solvent with a lower boiling point may be chosen when thicker films are desired, to ease the removal of the solvent as the film develops. The solvent may also be selected to improve compatibility with the specific nanoparticle-ionic liquid system, as a given non-volatile liquid may promote silica flocculation in some solvents but not others.

In some embodiments, the solvent is the one in which the commercially available nanoparticles are sold; for example, acidic silica particles sold under the tradename "ORGANO-SILICASOL" by Snowtex are sold in solutions of methanol, isopropanol, ethylene glycol, propylene glycol methyl ether acetate, methyl isobutyl ketone, Methyl ethyl ketone, N,N-Dimethyl acetamide, etc. As will be appreciated by those in the art, if a different solvent is desired, the solvents are readily exchanged using techniques well known in the art.

Additional Liquid Composite Composition Components

The nanoparticle liquid composite compositions of the invention can include additional components for a variety of structural or functional purposes. In one embodiment, the compositions can additionally include reactive agents such as chemical crosslinkers.

Crosslinking the particles can dramatically improve the mechanical properties of the films, with little or no loss in conductivity. The chief advantages of crosslinking are to improve the modulus and hardness, and to reduce the rate of creep. It is preferred, though not required, to use a crosslinking agent that is also a liquid, to minimize phase separation from the non-volatile liquid after solvent is removed before polymerization. However, in some embodiments a solid crosslinking agent is chosen that is soluble in the non-volatile liquid.

In one embodiment, the crosslinking agent is soluble in or miscible with the non-volatile liquid before polymerization, but will phase separate from the liquid on polymerization. This phase separation will allow the liquid to continue to freely traverse the interior of the nanocomposite. The phase separation that occurs will be nanoscopic in origin, as the nanoparticles prevent macroscopic separation of the crosslinking agent from the non-volatile liquid. As a result, the capillary pressure of the pores will be sufficient to keep the liquid constrained inside the solid matrix.

This nano-phase separation may occur on polymerization of a conventional monomer to give a linear polymer, as well as by using a bifunctional or multi-functional crosslinking agent. Although multi-functional agents are described below, this does not rule out the possibility that a mono-functional polymerizable agent, or a mixture of mono-functional and multi-functional agents, will give as good or better results under optimized conditions.

In a preferred embodiment, the volumes of the non-volatile liquid and crosslinking agent are such that, when solvent is removed, the resulting composite material is a viscous liquid, gel, or paste that can flow easily under stress. As a result, the tensile stresses that result from solvent evaporation can be relieved by motion of the nanoparticles, and no cracking is seen even in thick films. After solvent is removed, the crosslinking agent can be polymerized, resulting in a film with the desired mechanical properties.

There are several classes of crosslinking agents that may be used successfully to mechanically strengthen the composites. These agents can be polymerized using thermal initiation or UV initiation in conjunction with an appropriate initiating agent, can be directly polymerized by heating without an initiator, or can be polymerized by exposure to a chemical agent such as acid, base, or water. In all cases, it is preferred that the combination of non-volatile liquid/crosslinking agent is itself a liquid. In some embodiments, it is preferred that the crosslinking agent itself is a low-volatility liquid that is miscible but unreactive with the non-volatile liquid that will comprise the liquid component of the final product.

In some embodiments, it is preferred to use an A-A monomer that polymerizes preferentially with itself over the non-volatile component or the nanoparticle component, e.g. the "polymer" component of the liquid composite composition is independent of the other components. This crosslinking agent can include, but is not limited to, acrylates such as Di(ethylene glycol) diacrylate; Di(ethylene glycol) dimethacrylate; Ethylene glycol diacrylate; Ethylene glycol dimethacrylate; 1,6-Hexanediol diacrylate; Tetra(ethylene glycol) diacrylate; Triethylene glycol dimethacrylate; Fluorinated tetraethylene glycol diacrylate; Pentaerythritol propoxylate triacrylate; Bisphenol F ethoxylate (2 EO/phenol) diacrylate; 1,9-Bis (acryloyloxy)nonane; Di(trimethylolpropane) tetraacrylate; Neopentyl glycol propoxylate (1 PO/OH) diacrylate; Diurethane dimethacrylate; 1,9-Nonanediol dimethacrylate; Ethoxylated bisphenol "A" diacrylate; Dipentaerythritol pentaacrylate; Dipropylene Glycol Diacrylate; Trimethylolpropane propoxylate triacrylate; Tripropylene glycol diacrylate; Bisphenol A ethoxylate dimethacrylate; Bis[2-(methacryloyloxy)ethyl]phosphate; 2,2-Dimethylpropanediol diacrylate; Neopentyl Glycol Dimethacrylate; Bisphenol A glycerolate dimethacrylate; and 1,3-Butanediol dimethacrylate, and combinations of any of these.

This crosslinking agent can also include acrylamides, including, but not limited to, 1,4-Bis(acryloyl)piperazine; 2,2'-(Bisacrylamino)diethyldisulfide; N,N'-Hexamethylenebisacrylamide; N,N'-Ethylenebisacrylamide; 1,3,5-Triacryloyl-hexahydro-s-triazine; and N,N'-Dihydroxyethylenebis-acrylamide, and combinations of these.

In some embodiments, it is preferred to use an A-A monomer that polymerizes both with itself and the nanoparticle component. This crosslinking agent can include, but is not limited to, diisocyanates and triisocyanates such as: 4,4'-Methylenebis(cyclohexyl isocyanate); Toluenediisocyanate; 2,5-Diisothiocyanato-benzensulfonic acid; 2-Isocyanatoethyl 2,6-Diisocyanatohexanoate; 1-Chloromethyl-2,4-diisocyanatobenzene; 1,3-Bis(isocyanatomethyl)cyclohexane; 1,5-Diisocyanato-2-methylpentane; Trimethylhexamethylene diisocyanate; Poly(hexamethylene diisocyanate); 4,4'-Methylenebis(2-chlorophenyl isocyanate); 2,4,6-Trimethyl-1,3-phenylene diisocyanate; 1,8-Diisocyanatooctane; trans-1,4-Cyclohexane diisocyanate; 1,4-Diisocyanatobutane; 4,4'-Oxybis(phenyl isocyanate); Isophorone Diisocyanate; m-Xylene diisocyanate; 1,5-Naphthalene diisocyanate; 1,3-Bis(2-isocyanato-2-propyl)benzene; Triphenylmethane triisocyanate; Hexamethylene Diisocyanate; p-Phenylenediisocyanate; Diphenylmethane diisocyanate; Bitolylenediisocyanate; and Dianisidine Diisocyanate, and combinations of these.

This crosslinking agent can also include, but is not limited to, di- and poly-siloxanes such as: 1,3-Bis(3-methacryloxypropyl)tetrakis(trimethylsiloxy)disiloxane; p-Bis(trimethoxysilylmethyl)benzene; 4,4'-Bis(triethoxysilyl)-1,1'-biphenyl; Bis(trimethoxysilylpropyl)amine; Tris(3-trimethoxysilylpropyl)isocyanurate; Bis(trimethoxysilyl)hexane; Bis(trimethoxysilyl)octane; Bis(trimethoxysilyl)ethane; Bis(trimethoxysilyl)methane; 1,4-Bis(triethoxysilyl)benzene; and 1,3-Bis(triethoxysilyl)benzene, and combinations of these.

The crosslinking agent can also include di- and poly-epoxy compounds such as ethylene glycol diglycidyl ether; dienes such as divinyl benzene, etc.

In addition, combinations of any of these cross-linking agents may be used, independently selected from the agents recited herein.

Additional examples of crosslinking agents that find use herein also include bifunctional molecules with mixed reactive groups. Such agents may be especially preferred when one reactive side of the crosslinking agent has an enhanced affinity for the nanoparticle, or which can form a monolayer or multilayer on the nanoparticle before mixing with the non-volatile liquid. Such agents may include: 2-isocyanatoethyl methacrylate, 3-(acryloxypropyl)trimethoxysilane, etc.

It may also be preferred to add a pre-prepared nanoparticle coated with a reactive agent to a mixture of nonvolatile liquid and reactive agent, thus ensuring that the nanoparticle becomes covalently linked to the reactive agent during curing.

Examples of crosslinking agents also include A-A B-B systems such as ethylene glycol with 3,4-epoxycyclohexylmethyl 3,4-epoxycyclohexanecarboxylate. A special class of crosslinking agent comprises materials that polymerize to form polycations, which can serve to ionically link the nanoparticle together, such as 4,4' bipyridine and dibromoxylene, which react to form a polycation with bromide counterions.

Crosslinking agents can also be chosen from the class of sol-gel liquid precursor molecules. Such agents can form inorganic oxides that mechanically reinforce the nanoparticles in the composite. Such agents can include tetraalkoxysilanes such as tetramethoxysilane, tetraethoxysilane, etc. Aluminum oxides can be formed from aluminum hydroxides dissolved at high pH or soluble in ionic liquids at lower pH. Aluminates can also be formed from the hydrolysis of aluminum chlorides ($Al_xCl_y^-$) as anions in ionic liquid such as $EMI^+AlCl_4^-$. Transition metal oxides can also be formed from well-known sol-gel precursors by hydrolysis of their alkoxides, amides, or halide complexes. Transition metals that are amenable to deposition in this way include, but are not limited to: Cr, V, W, Mo, Nb, Ta, Cr, Fe, Ti, Hf, Zr, and Ce. In such embodiments, it may be preferred to adjust the pH of the system in order to optimize the final mechanical properties of the resulting composite.

Crosslinking can also be accomplished by covalently modifying the nanoparticle surface with a functional group (such as an acrylate or an epoxide), then cross-linking this functional group after forming the nanoparticle-liquid composite. For instance, treatment of the nanoparticles with 2-(3,4-Epoxycyclohexyl) ethyltriethoxysilane creates an epoxy-modified surface that can subsequently be polymerized with a reactive agent in the liquid phase or with another reactively-modified nanoparticle. Similarly, (3-Acryloxypropyl)trimethoxysilane can be used to create acrylate-modified nanoparticles that can be reacted to improved the composite's mechanical properties. The approach of modifying the nanoparticles to improve the performance of the final material can be extended to adding other functional groups to the surface of the nanoparticles, including but not limited to: alcohols, amines, thiols, ketones, aldehydes, phosphines, ammoniums, phosphoniums, carboxylic acids, carboxylates, sulfonic acid, sulfonates, sulfoxides, alkenes, alkynes, amides, ethers, anhydrides, and the like.

It is sometimes preferred to treat the nanoparticle composites with acid or base to modulate the zeta potential of the nanoparticles, which in turn can cause non-covalent crosslinking of the particles. For instance, exposure of a liquid composite comprising a 1:1 weight ratio of EMI-Im and IPA-ST nanoparticles (nanoparticle weight, not including the weight of the IPA) results in a paste. Exposure of this paste to vapors from an ammonim hydroxide solution turns this paste into a brittle solid, hinting that the nanoparticles have been deprotinated by ammonia, and have agglomerated into large structures as their zeta potential was shifted. It is worth noting that thick films of such a material remain transparent, indicated that any agglomeration is happening on scales of less than 100 nm or so.

Thus, as described above, in some embodiments, the nanoparticle liquid composite compositions include polymers. These embodiments include situations where the non-volatile liquid is polymerizable and where it is not. As will be appreciated by those in the art, the number of suitable polymers is extensive. In some embodiments, the polymer is miscible with the non-volatile liquid. Suitable polymers include, but are not limited to, any number of plastics (including acrylics, polystyrene and copolymers of styrene and other materials, polypropylene, polyethylene, polybutylene, polyurethanes), polysaccharides including dextrans, polyimides, polyethers, and polysulfones. In a preferred embodiment, the polymer is also a liquid such as a poly(ethylene glycol) or a derivatized poly(ethylene glycol). To ensure even distribution of the polymer, non-volatile liquid, and nanoparticles throughout the material, care must be taken in removing the solvent so as not to selectively precipitate one of the components before others.

Other additives that can impart favorable characteristics to a liquid composite composition (both polymeric and nanoparticle lccs), particularly a non-volatile liquid—nanoparticle composite include, but are not limited to: dyes or other optical agents (such as photoinitiators, as discussed above); biomolecules such as enzymes or nucleic acids including DNA; or inorganic salts or metal oxides (where the added material does not destroy the fluidity of the non-volatile liquid). In each case, there may be significant benefits to using a nanoparticle gelator that does not substantively interact with the additive, compared with previous polymer gels in the art.

Any of the additional components described herein can be added to the liquid composite compositions of the invention in any combination.

Properties of the Nanoparticle Liquid Composite Compositions

The solvent compositions can be cast into free-standing films that retain high conductivity, up to or greater than about 1 mS/cm at room temperature. They can also be spun-cast into thin films with high uniformity and low roughness. When reactive groups are dissolved in the solvent prior to film casting, the resulting film can be subsequently transformed to, for instance, cross-link the nanoparticles, or otherwise control the characteristics of the film.

The mechanical stability of the films results from the difficulty the nanoparticles have in flowing through a liquid containing a crowd of other particles. For a given volume fraction of particles, a composite containing larger particles will be stiffer (and flow less easily) than one containing smaller particles. A film supported by 10-15 nm silica particles at above 55 volume % loading has a measurable modulus, over 100 MPa, but does exhibit creep, as the particles can redistribute and flow slowly when a force is applied.

The improved mechanical and thermal stability of these nanoparticle composites versus previous gel electrolytes make them well suited for applications as an electrolyte in capacitors, batteries, fuel cells, electrochromic devices, and solar cells, among a wide variety of other uses, as are further outlined below. The nanoparticle composites may also find use as the active material in gas separation membranes, also as outlined below.

When the nanoparticle composite is formulated with a high density of solid filler, it is possible to sputter or evaporatively deposit materials from the vapor phase directly onto an exposed surface of the nanoparticle composition. In a preferred embodiment, these materials are conductive. In a preferred embodiment, the non-volatile liquid is an electrolyte, such as an ionic liquid, or a non-volatile liquid containing dissolved ions. This process enables simplified and reproducible fabrication of electrode-electrolyte interfaces suitable for use in, for example, an electrochemical cell. Such an electrolyte-electrode interface can be patterned and etched using conventional techniques, for example for applications in electronics.

In the absence of crosslinkers or other additives to knit the material together, the liquid composite is held together by a large capillary pressure. For example, in a system which constrains a liquid with a surface tension of 40 dynes/cm2 in cylindrical pores of 0.25 microns, the total capillary pressure holding in the liquid will be roughly 100 psi. By comparison, the same liquid is combined with 5 nm spherical particles at the maximum possible particle loading (the critical pigment volume concentration, which for spherical nanoparticles is approximately 64 vol % solids), the total capillary pressure is in excess of 10,000 psi Despite the large capillary pressure, and the solid nature of the material, the liquid is still free to diffuse inside the nanoparticle matrix. For example, the ionic liquid EMI-Im can be used as the non-volatile liquid component, and the conductivity of the resulting materials can be measured. At room temperature, the conductivity of EMI-Im is roughly 9 mS/cm. When 100 nm silica particles are used to construct the composite, at about 60 volume % silica, the conductivity of the films is roughly 3 mS/cm, and the conductivity loss can be accounted for entirely from diluting the carriers with the inert nanoparticles. When 10 nm or 5 nm particles are used, the conductivity drops to about 1 mS/cm, possibly indicating the effects of tortuosity, surface drag, or ionic impurities from the nanoparticles onto the ionic liquid.

NMR studies of the diffusion of the liquid throughout the solid can also be performed. For the EMI-Im systems discussed above, the diffusivity of the cation in the neat IL is $5.0 \times 10^{-8}$ cm2/sec [Figure X]. When a composite with 100 nm silica particle is prepared, the diffusivity of the cation drops to $3.4 \times 10^{-8}$ cm2/sec [Figure Y]. With 10 nm particles, it drops further to $0.7 \times 10^{-8}$ cm2/sec, and with 5 nm particles to $0.5 \times 10^{-8}$ cm2/sec [Figure Z]. Because the timescale of the NMR experiment (Hz) is much longer than the timescale of the conductivity measurements (MHz), the ions diffuse over a much longer path in NMR experiment, in the range of 1-10 microns. Without intending to be tied down to a particular theory, the drop in measured diffusivity probably reflects the increase in tortuosity of the composites as the particles scale down in size: as the liquid regions become smaller, the molecules will run into a silica wall more frequently, and thus diffuse over less net distance in a given unit of time. Thus, there is a trade-off between capillary pressure and diffusivity, and the composite may be optimized to maximize durability and permeability for a specific application.

One advantage of this invention is the material's capability of being cast as a thin film. Solutions of EMI-Im with 10 nm or 5 nm particles can be spun-coat in solvents such as PGMEA or ethyl lactate to <0.1 microns. Metal deposited on films >0.05 microns does not form shorts to the underlying substrate. These films can be scratched and show fracture like a solid, rather than flow like a liquid. Nevertheless, they display the same conductivity as thicker films, indicating the films preserve their underlying liquid character.

Another advantage of this invention is the extraordinarily high modulus obtainable for a gelled liquid. Dynamic nanoindentation of a liquid composite without crosslinker shows a modulus of 700 MPa (though this technique is limited in its ability to measure low modulus in the configuration used, so this may be an upper limit.) Addition of 1.7% by weight diisocyanate crosslinker can raise the modulus to above 2 GPa, while dropping conductivity only by 15%. Addition of more crosslinker (16%) can raise the modulus to above 4 GPa, with conductivity dropping 60% from the original material. These modulus values compare well with those of typical organic polymers such as PET (about 2-3 GPa) or polystyrene (about 3-4 GPa). Similar results can be obtained with other crosslinking agents, such as disiloxanes or diacrylates. Other crosslinkers may interact with the liquid/nanoparticle system better or worse than those described, but generally the mechanical properties of the initial films are favorable relative to other gels, and may be improved by appropriate additives without destroying molecular mobility.

Another advantage of the invention is the lowered CTE of the final electrolyte. By creating a material that is ½ or more nanoparticles by volume, the resulting material will have a CTE that will drop by ½ or more. This type of performance may be advantageous in systems where the electrolyte is encapsulated but must nonetheless see significant thermal cycling, as in a battery or supercapacitor.

Because of the limits of nanoindentation as a mechanical analysis tool, films must be >1 micron thick in order to get results that are independent of the substrate. TEM cross-sections of these and films that are <0.1 micron are largely similar, so it is assumed that measurements on 1 micron thick samples are representative of thinner films as well. (Note: TEM was performed on samples with a polymerizable, non-volatile liquid. The films were polymerized before sectioning in order to minimize the artifacts that result from sectioning, and it is assumed that this polymerization process did not significantly alter the film structure).

Applications of the Liquid Composite Compositions of the Invention

The compositions of the invention find use in a wide variety of applications, ranging from use as electrolytes in electronic memory, supercapacitors, battery electrolytes, embedded energy storage, fuel cell membranes, low-k or high-k dielectrics, membranes, electrochromic devices, dye sensitive solar cells, anti-static coatings and other coatings, and a variety of materials improvements, all of which are further outlined below.

Applications as Electrolytes

From a practical perspective, it is preferred to work with an electrolyte in the solid state, because otherwise care must be taken to ensure that the liquid electrolyte remains contained. For example, liquid inside a battery must be hermetically sealed to prevent leakage, and failure of such a seal will result in escape or evaporation of the liquid, followed by failure of the battery. Containing this liquid creates narrow constraints on the type of packaging that can be used, and thus adds expense to the final product.

In addition to reducing packaging costs, a solid state ionic conductor can enable direct integration of a component, such as a battery, into an electrical system. For example, the solid electrolyte lithium phosphorous oxynitride, LiPON, has been incorporated into a battery cell in order to reduce unwanted degradation of the lithium anode that can occur as a consequence of direct contact between the anode and a conventional battery electrolyte. (U.S. Pat. No. 5,314,765). The use of this solid electrolyte has enabled direct integration of lithium battery into a semiconductor device package (U.S. Pat. No. 5,597,660), which allows the shape of the battery to conform to the needs of the device, and reduces overall manufacturing costs.

The conductivity of the LiPON system, near 1 μS/cm, is still insufficient for many other applications of electrolyte. For example, a dye-sensitized solar cell (U.S. Pat. No. 5,084,365) requires an electrolyte with a conductivity of 21 mS/cm in order to obtain good efficiency. Such cells have been demonstrated using liquid electrolyte, but commercialization of this technology has been frustrated by difficulties of encapsulating such a system.

As a result, considerable research has been done to find an electrolyte system that does not have to be contained by an encapsulant. One of the most common solutions to this problem is to construct a polymer gel. Such a gel consists of an electrolyte dissolved in a solvent, crisscrossed by a polymer scaffolding so that it does not flow. Such a gelled system need not be mechanically constrained, though it still can suffer from evaporation, and has little mechanical integrity.

One improvement to conventional polymer gel electrolytes is to use an ionic liquid as the electrolyte medium. Ionic liquids are salts that are molten at easily accessible processing temperature, typically defined as salts with a melting point <100 C. Some of the most useful ionic liquids have melting points at room temperature or below, and nevertheless have a small vapor pressure. A sub-class of ionic liquids are hydrophobic, and thus maintain consistent physical properties across a wide range of ambient humidity (U.S. Pat. No. 5,827,602). An ionic liquid-based polymer gel with >1 mS/cm conductivity can function at high temperatures without encapsulation (J. Fuller, A. C. Breda, R. T. Carlin, "Ionic Liquid-Polymer Gel Electrolytes", Journal of the Electrochemical Society (1997) 144(4) L67-L70). Such gels can be prone to phase separation over time, however, and are thus of limited technological value. A gel adapted for use in solar cells has been reported with improved stability to phase separation (US Patent Application 20050039790), but long-term performance data is not available.

Recognizing the shortcomings of these approaches, Wang et al attempted to create a gel containing ionic liquids using silica nanoparticles (P. Wang, S. M. Zakeeruddin, P. Comte, I. Exnar, M. Gratzel, "Gelation of Ionic Liquid-Based Electrolytes with Silica Nanoparticles for Quasi-Solid-State Dye-Sensitized Solar Cells", Journal of the American Chemical Society (2003) v125, 1166-1167). Silica nanoparticles, sonicated into an ionic liquid, result in a soft 'gel' with good conductivity relative to its viscosity. Kato el at (T. Kato, T. Kado, S. Tanaka, A. Okazaki, S. Hayase, "Quasi-Solid Dye-Sensitized Solar Cells Containing Nanoparticles Modified with Ionic Liquid-Type Molecules", Journal of the Electrochemical Society, (2006) 153(3) A626-A630) use a similar approach, grinding titanium dioxide particles into an ionic liquid in order to obtain their material. These authors found that modifying the surface of the titanium dioxide with imidazolium compounds improved the conductivity of the nanoparticle/ionic liquid composite at any particle loading.

In the systems described above, solid particles were added directly to the ionic liquid, and ground or sonicated to distribute them. Another method of handling nanoparticles involves using them in a solution or dispersion in a solvent; however most nanoparticles are kept in dispersion as charged particles, and it is their repulsive ionic forces that keep the particles from coalescing while in solution. (C. J. Brinker and G. W. Scherer, *Sol-Gel Science: The Physics and Chemistry of Sol-Gel Processing*, 1990, Academic Press, Inc, San Diego, Calif.) When an ionic liquid, or any salt, is added to such a dispersion, the repulsive forces are screened by the free ions in solution, and the particles immediately aggregate. It is thus not practical to mix ionic liquids with a nanoparticle dispersion that is stabilized by charge, and as a result it is widely held that a mixture of nanoparticle and salts should be unstable and unusable.

However, Allen and Matijevic have previously shown that silica particles that are in weak to strong acid environments do not coagulate in relatively high salt concentrations in water (L. H. Allen, E. Matijevic, "Stability of Colloidal Silica", Journal of Colloid and Interface Science (1969) 31(3) 287-296). These particles can remain in suspension because of a hard shell of water that inhibits direct contact between silica particles.

Such a mixture goes against the conventional teaching on the handling of nanoparticles, and as a result it has not previously been used to make nanoparticle-electrolyte gels. Although acidic silica has unique properties that give it colloidal stability in the presence of dissolved salts, the surfaces of other particles can be modified in order to reduce their tendency to flocculate in the presence of ions. Such particles can be mixed in a solvent with an ionic liquid, or a conventional non-volatile liquid with dissolved electrolyte, in order to create a precursor solution which can be cast into a mechanically robust gelled film.

An electrolyte is commonly thought of as an ionic compound that can dissolve in a liquid, to produce a solution that is electrically conductive. In an electrolyte, the charge is carried by the dissolved ions, and such a system can also be called an ionic conductor. A broader definition of electrolyte encompasses any material, whether solid or liquid, that conducts using ions. Such an electrolyte can include a molten salt, or even a solid ionic material that operates at a temperature that allows for the migration of ions within the solid matrix.

From a practical perspective, it is preferred to work with an electrolyte in the solid state, otherwise care must be taken to ensure that the liquid electrolyte remains contained. For example, a liquid inside a battery must be hermetically sealed to prevent leakage, and failure of such a seal will result in escape or evaporation of the liquid, followed by failure of the battery. Containing this liquid creates narrow constraints on the type of packaging that can be used, and thus adds expense to the final product.

Thus the invention provides liquid composite compositions. The liquid composite compositions can be applied to a number of surfaces, and the solvent removed to form electrolyte compositions. By "electrolyte composition" herein is meant a material that conducts using ions. The electrolyte compositions of the invention are nanoparticle liquid composite compositions as described herein, utilizing non-volatile liquids. This non-volatile liquid may comprise an ionic liquid, or it may comprise another non-volatile liquid with dissolved ions as outlined herein.

For clarity, the term "solvent composition" refers to compositions comprising solvents with dispersed nanoparticles and one or more ionic liquids, and optionally other components such as reactive agents (e.g. crosslinking agents) as is more fully outlined below. Once the solvent has been removed, the compositions are referred to as "liquid composite compositions". In some embodiments, the liquid composite compositions are used in applications as electrolytes, and may be referred to herein as "electrolyte compositions". However, any use of the term "electrolyte composition" herein is not meant to be specifically limited to electrolyte uses.

Once made, the solvent compositions are applied, generally to a substrate, to form an electrolyte composition. The compositions of the invention (including both solvent and electrolyte compositions, as outlined below) can be applied to a wide variety of substrates depending on the ultimate use of the film. By "substrate" or "solid support" or other grammatical equivalents herein is meant any material that is suitable as a support onto which the electrolyte compositions can be formed. The substrate can comprise a wide variety of materials, as will be appreciated by those in the art. Such materials include, but are not limited to, printed circuit board materials, metal surfaces such as electrodes, glass and modified or functionalized glass, plastics (including acrylics, polystyrene and copolymers of styrene and other materials, polypropylene, polyethylene, polybutylene, polyurethanes), Teflon®, fiberglass, GETEK (a blend of polypropylene oxide and fiberglass), polyimides, polyethers, polysulfones, polysaccharides, nylon or nitrocellulose, resins, ceramics, mica, silica or silica-based materials, silicon and doped silicon, carbon, porous carbon, metals, inorganic glasses, and a variety of other polymers. It should be noted that these substrates are also suitable for use with the liquid composite compositions of the invention for other applications.

In a preferred embodiment, the substrate is a conducting or semiconducting surface which can be used as an electrode. By "electrode" herein is meant a device that either emits, controls, or receives electricity. More specifically, an electrode can be used to deliver or receive current to and from an electrochemical device.

Preferred electrodes are known in the art and include, but are not limited to, certain metals and their oxides or nitrides, including gold; platinum; palladium; silicon; aluminum; metal oxide electrodes including titanium oxide, tin oxide (and doped tin oxides), indium tin oxide, iridium oxide, tungsten oxide (including $WO_3$) and ruthenium oxides; titanium nitride and tantalum nitride; and carbon (including glassy carbon electrodes, graphite and carbon paste, single and multi-walled nanotubes, and porous carbon).

As will be appreciated by those in the art, the electrodes of the invention can take on a number of geometries, including standard formats, wells, troughs, planar formats, etc. As is described herein, the electrolyte compositions of the invention are electrically coupled to at least one of the electrodes of the system. "Electrically coupled" in this context reflects that current (including ionic current) will flow, and can include systems that utilize direct physical contact between the electrolyte compositions and the electrode(s), or systems that rely on the juxtaposition of the electrolyte composition and the electrode(s) such that electronic coupling occurs.

The substrate may also include arrays, i.e. wherein there is a matrix of addressable electrodes (herein generally referred to as "cells", "pads", "addresses" or "micro-locations"). By "array" herein is meant a plurality of cells in an array format; the size of the array will depend on the composition and end use of the array. Arrays containing from about 2 different locations to billions may be made. In some embodiments, the compositions of the invention may not be in array format; that is, for some embodiments, compositions comprising a single surface of electrolyte composition may be made as well. In addition, in some arrays, multiple substrates may be used, either of different or identical compositions. Thus for example, large arrays may comprise a plurality of smaller substrates.

Generally, the electrodes are a flat surface; however, this is only one of the possible conformations of the electrode and/or arrays of the invention.

Accordingly, the solvent composition can be applied to a substrate in a variety of ways, as will be appreciated by those in the art. Suitable methods include, but are not limited to:

casting, spin-coating, ink-jet printing, embossing, screen printing, and matrix-assisted pulsed laser evaporation (MAPLE).

In some embodiments, the composition is applied to a substrate and the substrate is subsequently removed, e.g. forming a free-standing composition.

The solvent can be removed in a number of ways, as will be appreciated by those in the art. In some embodiments, the compositions comprising the solvent, non-volatile liquid(s), nanoparticles and/or polymers, and optional other components as described herein, can be applied, and then the solvent removed. Alternatively, the process of applying the compositions will remove the solvent.

In some embodiments, the composition is applied, and the solvent subsequently removed. For example, the solvent compositions may be cast onto a substrate and the solvent allowed to evaporate, either under atmospheric conditions, with the application of heat (e.g. baking the film at elevated temperatures ranging from about 50 C, 100 C or 150 C or greater), or with the application of vacuum.

In some embodiments, the act of applying the solvent composition to the substrate simultaneously applies the electrolyte composition and removes the solvent. For example, deposition methods including ink-jet printing and MAPLE result in a dry material being applied to the substrate.

The resulting electrolyte compositions have conductivities ranging from less than 10 µS/cm to greater than about 1 mS/cm. Desirable conductivities will depend on the ultimate use of the composition, and, as outlined herein, in some embodiments the conductivity is not relevant to the use of the materials.

The thickness of the resulting compositions can vary widely, depending on the method of application and the desired use. For example, spin coating can result in films as thin as or thinner than about 50 nm or as thick as about 2 microns. Thicker films can be made by casting and can be up to several hundred microns, and beyond, if needed. In addition, lower loadings of nanoparticles can form electrolyte composition gels that can be melted by heating and reformed by cooling; these materials can be used, for example, to fill a cavity that has been placed under vacuum. Higher loadings of nanoparticles can result in films with dramatically higher modulus than conventional gels, and which fracture under applied stresses. In all cases, solution processing affords materials properties and geometries that are not obtainable by prior methods of gelling liquids.

There are a variety of post-synthesis steps that can also be done. For example, the top of the electrolyte composition can be etched to improve the film-metal interface with deposited metals. Similarly, the films can be treated with substances, such as a base, to stabilize the compositions. The top surface of the compositions can be lightly sputtered to seal off the pores of porous embodiments of the composition. Cracking of the film can be minimized using agents such as formamide One advantage of the present invention is nanoparticle/non-volatile liquid composite films can be used as a substrate for the deposition of a conductive film, where the conductive film serves, for example as a top electrode in a capacitor or electrochemical cell.

Sputtering and evaporation techniques for the deposition of conductive metals, metal oxides, metal nitrides, etc. require that a high vacuum be maintained inside the deposition apparatus. A conventional electrolyte gel, consisting of salts dissolved in an organic solvent and gelled by a crosslinked polymer, is not suitable as a substrate for this technique because of the volatility of organic solvents.

A polymer can be used to gel an ionic liquid, thus creating a system that can survive in a vacuum chamber. Such systems are poorly suited as substrates for metal deposition, however, for two reasons: 1) because such a substrate has considerable liquid character, there is no fixed surface upon which a film can nucleate; instead, metal may coalesce into nanoparticles which then diffuse into the bulk of the gel. This leads to poor interface stability, and the possibility of shorting via chains of nanoparticles that permeate through the film. 2) Gas phase metal clusters can react with the surface of a polymer/IL gel, creating an insulating layer between the electrolyte and the metal. As such, it is a considerable challenge to deposit a top electrode from the vapor phase on top of a gel electrolyte. These issues are addressed using the Iccs described herein; a nanoparticle liquid composite composition used as an electrolyte has several advantages over current systems as a substrate for vapor deposition of a conductive top electrode. If the nanoparticles in the system have a surface which is a stable, inorganic material, such as silicon dioxide, these nanoparticles can serve as sites for nucleation of a vapor-deposited film. The high macroscopic viscosity of these films also inhibits diffusion of nanoscopic metal clusters into the bulk. As a result, smooth, uniform, reproducible metal films can be deposited atop the electrolyte, with good electrical contact between the two. The capacitance of such a system can be equivalent to what is achievable using bulk liquid, such as an ionic liquid.

In some embodiments, the compositions are defined by the modulus of the resulting composition. "Modulus" in this context is a physical measure of the stiffness in a material. When cast as a thin film the electrolyte compositions of some embodiments of the invention are stiff and brittle materials, possessing a Young's modulus of up to 700 MPa as measured by nanoindentation, which is more than two orders of magnitude higher than the modulus of conventional gels. In these embodiments, thin films of the electrolyte compositions of the invention do not leave a "wake" or "trail" when scratched; rather, little effect is seen until the pressure is high enough to result in "cracking" of the material, when jagged edges may be seen.

Memory Applications for Electrolyte Compositions

In one embodiment, the compositions find particular use in memory applications, as is generally described in U.S. Pat. Nos. 6,208,553, 6,381,169, 6,657,884, 6,324,091, 6,272,038, 6,212,093, 6,451,942, 6,777,516, 6,674,121, 6,642,376, 6,728,129, US Publication Nos: 20060092687, 20050243597, 20060209587 20060195296 20060092687 20060081950 20050270820 20050243597 20050207208 20050185447 20050162895 20050062097 20050041494 20030169618 20030111670 20030081463 20020180446 20020154535 20020076714, 2002/0180446, 2003/0082444, 2003/0081463, 2004/0115524, 2004/0150465, 2004/0120180, 2002/010589, U.S. Ser. Nos. 10/766,304, 10/834,630, 10/628,868, 10/456,321, 10/723,315, 10/800,147, 10/795,904, 10/754,257, 60/687,464, all of which are expressly incorporated in their entirety, and particularly for their disclosure of different ReAMs and the molecules and definitions (especially of the R groups) therein.

The compositions described herein can be used to synthesize a wide variety of hybrid components and/or devices (e.g. field effect transistors, sensors, memory elements, memory chips, etc.). In certain embodiments, the methods are used to assemble hybrid memory devices where information is stored in a redox-active information storage molecule.

In this embodiment, the invention provides devices comprising the Iccs of the invention in combination with redox active moieties (ReAMs) on electrodes for use in volatile memory devices. ReAMs comprising porphyrins (particularly porphyrin derivatives and substituted porphyrins, such as porphyrins substituted with metallocenes such as ferrocene) find particular use in a number of these applications.

Redox Active Molecules

In general, as described below, there are several types of ReAMs useful in the present invention, all based on polydentate proligands, including macrocyclic and non-macrocyclic moieties. A number of suitable proligands and complexes, as well as suitable substituents, are outlined in U.S. Pat. Nos. 6,212,093; 6,728,129; 6,451,942; 6,777,516; 6,381,169; 6,208,553; 6,657,884; 6,272,038; 6,484,394; and U.S. Ser. Nos. 10/040,059; 10/682,868; 10/445,977; 10/834,630; 10/135,220; 10/723,315; 10/456,321; 10/376,865; and of U.S. Pub. No. 2007/0108438, all of which are expressly incorporated by reference, in particular for the structures, descriptions and definitions thereof depicted therein.

Suitable proligands fall into two categories: ligands which use nitrogen, oxygen, sulfur, carbon or phosphorus atoms (depending on the metal ion) as the coordination atoms (generally referred to in the literature as sigma (a) donors) and organometallic ligands such as metallocene ligands (generally referred to in the literature as pi (71) donors, and depicted in U.S. Pub. No. 2007/0108438 as Lm).

In addition, a single ReAM may have two or more redox active subunits. For example, as shown in FIG. 13A of U.S. Pub. No. 2007/0108438, there are two redox active subunits, a porphyrin (shown in FIG. 13 of U.S. Pub. No. 2007/0108438, in the absence of a metal) and a ferrocene (both of which can be optionally substituted with independently selected substituents at any position, as described below and depicted in FIG. 13B of U.S. Pub. No. 2007/0108438), usually, but optionally, attached via a linker, L. Similarly, sandwich coordination compounds are considered a single ReAM. This is to be distinguished from the case where these ReAMs are polymerized as monomers; for example, FIG. 13C of U.S. Pub. No. 2007/0108438, depicts a polymerized version of FIG. 13B of U.S. Pub. No. 2007/0108438, wherein h is an integer of 2 or more. In addition, the metal ions/complexes of the invention may be associated with a counterion, not generally depicted herein.

Macrocyclic Ligands

In one embodiment, the ReAM is a macrocyclic ligand, which includes both macrocyclic proligands and macrocyclic complexes. By "macrocyclic proligand" herein is meant a cyclic compound which contain donor atoms (sometimes referred to herein as "coordination atoms") oriented so that they can bind to a metal ion and which are large enough to encircle the metal atom. In general, the donor atoms are heteroatoms including, but not limited to, nitrogen, oxygen and sulfur, with the former being especially preferred. However, as will be appreciated by those in the art, different metal ions bind preferentially to different heteroatoms, and thus the heteroatoms used can depend on the desired metal ion. In addition, in some embodiments, a single macrocycle can contain heteroatoms of different types.

A "macrocyclic complex" is a macrocyclic proligand with at least one metal ion; in some embodiments the macrocyclic complex comprises a single metal ion, although as described below, polynucleate complexes, including polynucleate macrocyclic complexes, are also contemplated.

A wide variety of macrocyclic ligands find use in conjunction with the electrolyte compositions of the invention, including those that are electronically conjugated and those that may not be; however, the macrocyclic ligands of the invention preferably have at least one, and preferably two or more oxidation states, with 4, 6 and 8 oxidation states being of particular significance.

A broad schematic of a suitable macrocyclic ligand is shown and described in FIG. 15 of U.S. Pub. No. 2007/0108438. In this embodiment, roughly based on porphyrins, a 16 member ring (when the —X— moiety contains a single atom, either carbon or a heteroatom), 17 membered rings (where one of the —X— moieties contains two skeletal atoms), 18 membered rings (where two of the —X— moieties contains two skeletal atoms), 19 membered rings (where three of the —X— moieties contains two skeletal atoms) or 20 membered rings (where all 5 four of the —X— moieties contains two skeletal atoms), are all contemplated. Each —X— group is independently selected. The moiety, together with the skeletal—C¬heteroatom-C (with either single or double bonds independently connecting the carbons and heteroatom) for 5 or 6 membered rings that are optionally substituted with 1 or 2 (in the case of 5 membered rings) or 1, 2, or 3 (in the case of 6 membered rings) with independently selected R2 groups. In some embodiments, the rings, bonds and substitutents are chosen to result in the compound being electronically conjugated, and at a minimum to have at least two oxidation states.

In some embodiments, the macrocyclic ligands for use in conjunction with the electrolyte compositions of the invention are selected from the group consisting of porphyrins (particularly porphyrin derivatives as defined below), and cyclen derivatives.

Porphyrins

A particularly preferred subset of macrocycles suitable for use in conjunction with the electrolyte compositions of the invention are porphyrins, including porphyrin derivatives. Such derivatives include porphyrins with extra rings ortho-fused, or ortho-perifused, to the porphyrin nucleus, porphyrins having a replacement of one or more carbon atoms of the porphyrin ring by an atom of another element (skeletal replacement), derivatives having a replacement of a nitrogen atom of the porphyrin ring by an atom of another element (skeletal replacement of nitrogen), derivatives having substituents other than hydrogen located at the peripheral (meso-, (3- or core atoms of the porphyrin, derivatives with saturation of one or more bonds of the porphyrin (hydroporphyrins, e.g., chlorins, bacteriochlorins, isobacteriochlorins, decahydroporphyrins, corphins, pyrrocorphins, etc.), derivatives having one or more atoms, including pyrrolic and pyrromethenyl units, inserted in the porphyrin ring (expanded porphyrins), derivatives having one or more groups removed from the porphyrin ring (contracted porphyrins, e.g., corrin, corrole) and combinations of the foregoing derivatives (e.g. phthalocyanines, sub-phthalocyanines, and porphyrin isomers). Additional suitable porphyrin derivatives include, but are not limited to the chlorophyll group, including etiophyllin, pyrroporphyrin, rhodoporphyrin, phylloporphyrin, phylloerythrin, chlorophyll a and b, as well as thehemoglobin group, including deuteroporphyrin, deuterohemin, hemin, hematin, protoporphyrin, mesohemin, hematoporphyrin mesoporphyrin, coproporphyrin, uruporphyrin and turacin, and the series of tetraarylazadipyrromethines.

As is true for the compounds outlined herein, and as will be appreciated by those in the art, each unsaturated position, whether carbon or heteroatom, can include one or more substitution groups as defined herein, depending on the desired valency of the system.

In one preferred embodiment, the redox-active molecule may be a metallocene as shown in the formula of FIG. 12A of U.S. 2007/0108438 where L is a linker, M is a metal (e.g., Fe, Ru, Os, Co, Ni, Ti, Nb, Mn, Re, V, Cr, W), S and SZ are substituents independently selected from the group consisting of aryl, phenyl, cycloalkyl, alkyl, halogen, alkoxy, alkylthio, perfluoroalkyl, perfluoroaryl, pyridyl, cyano, thiocyanato, nitro, amino, alkylamino, acyl, sulfoxyl, sulfonyl, imido, amido, and carbamoyl. In preferred embodiments, a substituted aryl group is attached to the porphyrin, and the substituents on the aryl group are selected from the group consisting of aryl, phenyl, cycloalkyl, alkyl, halogen, alkoxy, alkylthio, perfluoroalkyl, perfluoroaryl, pyridyl, cyano, thiocyanato, nitro, amino, alkylamino, acyl, sulfoxyl, sulfonyl, imido, amido, and carbamoyl.

It will be appreciated that the oxidation potentials of the members of the series can be routinely altered by changing the metal (M) or the substituents.

Another preferred redox-active molecule is a porphyrin illustrated by the formula of FIG. 12H of U.S. 2007/0108438 where, F is a redox-active subunit (e.g., a ferrocene, a substituted ferrocene, a metalloporphyrin, or a metallochlorin, etc.), J1 is a linker, M is a metal (e.g., Zn, Mg, Cd, Hg, Cu, Ag, Au, Ni, Pd, Pt, Co, Rh, Ir, Mn, B, Al, Ga, Pb, and Sn), S1 and S2 are independently selected from the group consisting of aryl, phenyl, cycloalkyl, alkyl, halogen, alkoxy, alkylthio, perfluoroalkyl, perfluoroaryl, pyridyl, cyano, thiocyanato, nitro, amino, alkylamino, acyl, sulfoxyl, sulfonyl, imido, amido, and carbamoyl wherein said substituents provide a redox potential range of less than about 2 volts, K1, KZ, K3, and K4 are independently selected from the group consisting of N, O, S, Se, Te, and CH; L is a linker; X is selected from the group consisting of a substrate, a reactive site that can covalently couple to a substrate, and a reactive site that can ionically couple to a substrate. In preferred embodiments, X or L-X may be an alcohol or a thiol. In some embodiments L-X can be eliminated and replaced with a substituent independently selected from the same group as SI or S2.

Control over the hole-storage and hole-hopping properties of the redox-active units of the redox-active molecules used in the memory devices of the present invention allows fine control over the architecture of the memory device.

Such control is exercised through synthetic design. The hole-storage properties depend on the oxidation potential of the redox-active units or subunits that are themselves or are that are used to assemble the storage media used in the devices of this invention. The hole-storage properties and redox potential can be tuned with precision by choice of base molecule(s), associated metals and peripheral substituents (Yang et al. (1999) J. Porphyrins Phthalocyanines, 3: 117-147), the disclosure of which is herein incorporated by this reference.

For example, in the case of porphyrins, Mg porphyrins are more easily oxidized than Zn porphyrins, and electron withdrawing or electron releasing aryl groups can modulate the oxidation properties in predictable ways. Hole-hopping occurs among isoenergetic porphyrins in a nanostructure and is mediated via the covalent linker joining the porphyrins (Seth et al. (1994) J. Am. Chem. Soc., 116: 10578-10592, Seth et al (1996) J. Am. Chem. Soc., 118: 11194-11207, Strachan et al. (1997) J. Am. Chem. Soc., 119: 11191¬11201; Li et al. (1997) J. Mater. Chem., 7: 1245-1262, Strachan et al. (1998) Inorg. Chem., 37: 1191-1201, Yang et al. (1999) J. Am. Chem. Soc., 121: 4008-4018), the disclosures of which are herein specifically incorporated by this reference in their entirety.

The design of compounds with predicted redox potentials is well known to those of ordinary skill in the art. In general, the oxidation potentials of redox-active units or subunits are well known to those of skill in the art and can be looked up (see, e.g., Handbook of Electrochemistry of the Elements). Moreover, in general, the effects of various substituents on the redox potentials of a molecule are generally additive. Thus, a theoretical oxidation potential can be readily predicted for any potential data storage molecule. The actual oxidation potential, particularly the oxidation potential of the information storage molecule(s) or the information storage medium can be measured according to standard methods. Typically the oxidation potential is predicted by comparison of the experimentally determined oxidation potential of a base molecule and that of a base molecule bearing one substituent in order to determine the shift in potential due to that particular substituent. The sum of such substituent-dependent potential shifts for the respective substituents then gives the predicted oxidation potential.

The suitability of particular redox-active molecules for use in conjunction with the electrolyte compositions of the invention can readily be determined. First, the molecule(s) of interest are coupled to a surface (e.g., a hydrogen passivated surface) according to the methods of this invention. Then sinusoidal voltammetry can be performed (e.g., as described herein or in U.S. Pat. Nos. 6,272,038; 6,212,093; and 6,208,553, PCT Publication WO 01/03126, or by (Roth et al. (2000) Vac. Sci. Technol. B 18:2359-2364; Roth et al. (2003) J.A.m. Chem. Soc. 125:505-517, all of which are incorporated by reference in their entirety) to evaluate 1) whether or not the molecule(s) coupled to the surface, 2) the degree of coverage (coupling); 3) whether or not the molecule(s) are degraded during the coupling procedure, and 4) the stability of the molecule(s) to multiple read/write operations. The electrolyte compositions are applied, optionally with a second metal deposition layer, and tested.

In addition, included within the definition of "porphyrin" are porphyrin complexes, which comprise the porphyrin proligand and at least one metal ion. Suitable metals for the porphyrin compounds will depend on the heteroatoms used as coordination atoms, but in general are selected from transition metal ions. The term "transition metals" as used herein typically refers to the 38 elements in groups 3 through 12 of the periodic table. Typically transition metals are characterized by the fact that their valence electrons, or the electrons they use to combine with other elements, are present in more than one shell and consequently often exhibit several common oxidation states. In certain embodiments, the transition metals of this invention include, but are not limited to one or more of scandium, titanium, vanadium, chromium, manganese, iron, cobalt, nickel, copper, zinc, yttrium, zirconium, niobium, molybdenum, technetium, ruthenium, rhodium, palladium, silver, cadmium, hafnium, tantalum, tungsten, rhenium, osmium, iridium, platinum, gold, mercury, rutherfordium, and/or oxides, and/or nitrides, and/or alloys, and/or mixtures thereof.

Other Macrocycles

There are also a number of macrocycles based on cyclen derivatives. FIG. 17 13C of U.S. Pub. No. 2007/0108438, depicts a number of macrocyclic proligands loosely based on cyclen/cyclam derivatives, which can include skeletal expansion by the inclusion of independently selected carbons or heteroatoms. In some embodiments, at least one R group is a redox active subunit, preferably electronically conjugated to the metal. In some embodiments, including when at least one R group is a redox active subunit, two or more neighboring R2 groups form cyclo or an aryl group.

Furthermore, in some embodiments, macrocyclic complexes relying organometallic ligands are used. In addition to purely organic compounds for use as redox moieties, and various transition metal coordination complexes with 8-bonded organic ligand with donor atoms as heterocyclic or exocyclic substituents, there is available a wide variety of transition metal organometallic compounds with It-bonded organic ligands (see Advanced Inorganic Chemistry, 5th Ed., Cotton & Wilkinson, John Wiley & Sons, 1988, chapter 26; Organometallics, A Concise Introduction, Elschenbroich et al., 2nd Ed., 1992, 30 VCH; and Comprehensive Organometallic Chemistry II, A Review of the Literature 1982¬1994, Abel et al. Ed., Vol. 7, chapters 7, 8, 1.0 & 11, Pergamon Press, hereby expressly incorporated by reference). Such organometallic ligands include cyclic aromatic compounds such as the cyclopentadienide ion [C5H5(−1)] and various ring substituted and ring fused derivatives, such as the indenylide (−1) ion, that yield a class of bis(cyclopentadieyl)metal compounds, (i.e. the metallocenes); see for example Robins et al., J. Am. Chem. Soc. 104:1882-1893 (1982); and Gassman et al., J. Am. Chem. Soc. 108:4228-4229 (1986), incorporated by reference. Of these, ferrocene [(C5H5)2Fe] and its derivatives are prototypical examples which have been used in a wide variety of chemical (Connelly et al., Chem. Rev. 96:877-910 (1996), incorporated by reference) and electrochemical (Geiger et al., Advances in Organometallic Chemistry 23:1-93; and Geiger et al., Advances in Organometallic Chemistry 24:87, incorporated by reference) electron transfer or "redox" reactions. Metallocene derivatives of a variety of the first, second and third row transition metals are useful as redox moieties (and redox subunits). Other potentially suitable organometallic ligands include cyclic arenes such as benzene, to yield bis(arene)metal compounds and their ring substituted and ring fused derivatives, of which bis(benzene) chromium is a prototypical example, Other acyclic n-bonded ligands such as the ally1(−1) ion, or butadiene yield potentially suitable organometallic compounds, and all such ligands, in conjunction with other 7c-bonded and 8-bonded ligands constitute the general class of organometallic compounds in which there is a metal to carbon bond. Electrochemical studies of various dimers and oligomers of such compounds with bridging organic ligands, and additional non-bridging ligands, as well as with and without metal-metal bonds are all useful.

When one or more of the co-ligands is an organometallic ligand, the ligand is generally attached via one of the carbon atoms of the organometallic ligand, although attachment may be via other atoms for heterocyclic ligands. Preferred organometallic ligands include metallocene ligands, including substituted derivatives and the metalloceneophanes (see page 1174 of Cotton and Wilkenson, supra). For example, derivatives of metallocene ligands such as methylcyclopentadienyl, with multiple methyl groups being preferred, such as pentamethylcyclopentadienyl, can be used to increase the stability of the metallocene. In some embodiments, the metallocene is derivatized with one or more substituents as outlined herein, particularly to alter the redox potential of the subunit or moiety.

As described herein, any combination of ligands may be used. Preferred combinations include: a) all ligands are nitrogen donating ligands; b) all ligands are organometallic ligands.

Sandwich Coordination Complexes

In some embodiments, the ReAMs are sandwich coordination complexes. The terms "sandwich coordination compound" or "sandwich coordination complex" refer to a compound of the formula L-Mn-L, where each L is a heterocyclic ligand (as described herein), each M is a metal, n is 2 or more, most preferably 2 or 3, and each metal is positioned between a pair of ligands and bonded to one or more hetero atom (and typically a plurality of hetero atoms, e.g., 2, 3, 4, 5) in each ligand (depending upon the oxidation state of the metal). Thus sandwich coordination compounds are not organometallic compounds such as ferrocene, in which the metal is bonded to carbon atoms. The ligands in the sandwich coordination compound are generally arranged in a stacked orientation (i.e., are generally cofacially oriented and axially aligned with one another, although they may or may not be rotated about that axis with respect to one another) (see, e.g., Ng and Jiang (1997) Chemical Society Reviews 26: 433-442) incorporated by reference. Sandwich coordination complexes include, but are not limited to "double-decker sandwich coordination compound" and "triple-decker sandwich coordination compounds". The synthesis and use of sandwich coordination compounds is described in detail in U.S. Pat. Nos. 6,212,093; 6,451,942; 6,777,516; and polymerization of these molecules is described in U.S. Ser. No. 10/800,147, now U.S. Pat. No. 7,452,572, entitled Procedure for Preparing Redox-Active Polymers on Surfaces, Bocian, Liu and Lindsay, assigned to the Regents of the University of California, all of which are included herein, particularly the individual substitutent groups that find use in both sandwich complexes and the "single" macrocycle" complexes.

The term "double-decker sandwich coordination compound" refers to a sandwich coordination compound as described above where n is 2, thus having the formula L'-M'-LZ, wherein each of LI and LZ may be the same or different (see, e.g., Jiang et al. (1999) J. Porphyrins Phthalocyanines 3: 322-328) and U.S. Pat. Nos. 6,212,093; 6,451,942; 6,777,516; and polymerization of these molecules is described in U.S. Ser. No. 10/800,147, now U.S. Pat. No. 7,452,572, entitled Procedure for Preparing Redox-Active Polymers on Surfaces; Bocian, Liu and Lindsay, assigned to the Regents of the University of California hereby incorporated by reference in its entirety.

The term "triple-decker sandwich coordination compound" refers to a sandwich coordination compound as described above where n is 3, thus having the formula L'-M' LZ-MZ-L3, wherein each of LI, LZ and L3 may be the same or different, and MI and MZ may be the same or different (see, e.g., Arnold et al. (1999) Chemistry Letters 483-484), and U.S. Pat. Nos. 6,212,093; 6,451,942; 6,777,516; and polymerization of these molecules is described in U.S.S.N. entitled Procedure for Preparing Redox-Active Polymers on Surfaces, Bocian, Liu and Lindsay, assigned to the Regents of the University of California, hereby incorporated by reference in their entirety.

In addition, polymers of these sandwich compounds are also of use; this includes "dyads" and "triads" as described in U.S. Pat. Nos. 6,212,093; 6,451,942; 6,777,516; and polymerization of these molecules is described in U.S. Pub. No. 20070123618, all of which are incorporated by reference in their entirety.

Non-Macrocyclic Proligands and Complexes

As a general rule, ReAMs comprising non-macrocyclic chelators are bound to metal ions to form non-macrocyclic chelate compounds, since the presence of the metal allows for multiple proligands to bind together to give multiple oxidation states.

In some embodiments, nitrogen donating proligands are used. Suitable nitrogen donating proligands are well known in the art and include, but are not limited to, NH2; NFIR; NRR'; pyridine; pyrazine; isonicotinamide; imidazole; bipyridine and substituted derivatives of bipyridine; terpyridine and substituted derivatives; phenanthrolines, particularly 1,10-phenanthroline (abbreviated phen) and substituted derivatives of phenanthrolines such as 4,7-dimethylphenanthroline and dipyridol[3,2-a:2',3'-c]phenazine (abbreviated dppz); dipyridophenazine; 1,4,5,8,9,12-hexaazatriphenylene (abbreviated hat); 9,10-phenanthrenequinone diimine (abbreviated phi); 1,4,5,8-tetraazaphenanthrene (abbreviated tap); 1,4,8,11-tetra-azacyclotetradecane (abbreviated cyclam) and isocyanide. Substituted derivatives, including fused derivatives, may also be used. It should be noted that macrocylic ligands that do not coordinatively saturate the metal ion, and which require the addition of another proligand, are considered non-macrocyclic for this purpose. As will be appreciated by those in the art, it is possible to covalent attach a number of "non-macrocyclic" ligands to form a coordinatively saturated compound, but that is lacking a cyclic skeleton.

Suitable sigma donating ligands using carbon, oxygen, sulfur and phosphorus are known in the art. For example, suitable sigma carbon donors are found in Cotton and Wilkenson, Advanced Organic Chemistry, 5th Edition, John Wiley & Sons, 1988, hereby incorporated by reference; see page 38, for example. Similarly, suitable oxygen ligands include crown ethers, water and others known in the art. Phosphines and substituted phosphines are also suitable; see page 38 of Cotton and Wilkenson.

The oxygen, sulfur, phosphorus and nitrogen-donating ligands are attached in such a manner as to allow the heteroatoms to serve as coordination atoms.

Polynucleating Proligands and Complexes

In addition, some embodiments utilize polydentate ligands that are polynucleating ligands, e.g. they are capable of binding more than one metal ion. These may be macrocyclic or non-macrocyclic.

A number of suitable proligands and complexes, as well as suitable substituents, are outlined in U.S. Pat. Nos. 6,212,093; 6,728,129; 6,451,942; 6,777,516; 6,381,169; 6,208,553; 6,657,884; 6,272,038; 6,484,394; and U.S. Ser. Nos. 10/040,059; 10/682,868; 10/445,977; 10/834,630; 10/135,220; 10/723,315; 10/456,321; 10/376,865; all of which are expressly incorporated by reference, in particular for the structures and descriptions thereof depicted therein.

ReAM Polymers

The memory elements of the invention may also comprise polymers of the ReAMs as outlined above (as distinguished from the polymers used for the electrolyte compositions); for example, porphyrin polymers (including polymers of porphyrin complexes), macrocycle complex polymers, ReAMs comprising two redox active subunits, etc. can be utilized. The polymers can be homopolymers or heteropolymers, and can include any number of different mixtures (admixtures) of monomeric ReAMs, wherein "monomer" can also include ReAMs comprising two or more subunits (e.g. a sandwich coordination compound, a porphyrin derivative substituted with one or more ferrocenes, etc.). ReAM polymers are described in U.S. Pub. No. 20070123618 which is expressly incorporated by reference in its entirety.

The configuration of the polymers on the electrode can vary. In some embodiments, the polymers are linear in the Z dimension (the direction perpendicular to the substrate surface, as is depicted in FIG. 14A of U.S. Pub. No. 2007/0108438), and can be optionally crosslinked (FIG. 14B). Branched polymers in the Z dimension are also contemplated, and can be optionally crosslinked as well. Linear polymers in the X-Y-dimension (FIG. 14C), or branched and/or crosslinked polymers are also included. In addition, mixtures of polymers can be used in any of these configurations.

In some embodiments, configurations (including selection of linkers) that control orientation and spacing of the ReAMs, whether polymeric or monomeric, are preferred, as generally higher densities of the ReAMs can be achieved, as well as better electron transfer and electron transfer rates. Linker length can contribute to the rate and retention of charge.

In general, the polymerization embodiments rely on the use of substitutents that will result in both attachment to the electrode surface as well as polymerization to additional ReAMs. As described in U.S. Pub. No. 20070123618 there are two general methods for the synthesis of these ReAMs: "in situ" polymerization on the surface, and prepolymerization followed by addition to the surface using one or more attachment moieties, expressly incorporated by reference in its entirety, and with particular respect herein as to the "one-step" and "two-step" polymerization/attachment steps.

In various embodiments those oxidation states can be provided by one or more redox-active units. A redox-active unit refers to a molecule or to a subunit of a molecule that has one or more discrete oxidation states that can be set by application of an appropriate voltage. Thus, for example, in one embodiment, the redox-active molecule can comprise two or more (e.g. 8) different and distinguishable oxidation states. Typically, but not necessarily, such multi-state molecules will be composed of several redox-active units (e.g., porphyrins, metallocenes, etc.). Each redox-active molecule is itself at least one redox-active unit, or comprises at least one redox-active unit, but can easily comprise two or more redox-active units.

Preferred redox-active molecules include, but are not limited to porphyrinic macrocycles. The term "porphyrinic macrocycle" refers to a porphyrin or porphyrin derivative. Such derivatives include porphyrins with extra rings ortho-fused, or ortho¬perifused, to the porphyrin nucleus, porphyrins having a replacement of one or more carbon atoms of the porphyrin ring by an atom of another element (skeletal replacement), derivatives having a replacement of a nitrogen atom of the porphyrin ring by an atom of another element (skeletal replacement of nitrogen), derivatives having substituents other than hydrogen located at the peripheral (meso-, 13-) or core atoms of the porphyrin, derivatives with saturation of one or more bonds of the porphyrin (hydroporphyrins, e.g., chlorins, bacteriochlorins, isobacteriochlorins, decahydroporphyrins, corphins, pyrrocorphins, etc.), derivatives obtained by coordination of one or more metals to one or more porphyrin atoms (metalloporphyrins), derivatives having one or more atoms, including pyrrolic and pyrromethenyl units, inserted in the porphyrin ring (expanded porphyrins), derivatives having one or more groups removed from the porphyrin ring (contracted porphyrins, e.g., corrin, corrole) and combinations of the foregoing derivatives (e.g. phthalocyanines, sub-phthalocyanines, and porphyrin isomers). Preferred porphyrinic macrocycles comprise at least one 5-membered ring.

Constrained Liquid Membrane Applications

In addition to their use as electrolyte compositions in memory applications, particularly molecular memory applications, the Iccs of the invention find use in membrane applications as well. Membranes have been used commercially for the separation of economically important gasses for going on three decades. In such a system, a mixture of gasses at high pressure is passed over a membrane, and the gasses permeate through the membrane to a region of lower pressure. Ideally, one of the gasses diffuses through the membrane much more quickly than the other(s), and both the high pressure "retentate" and the low pressure "permeate" can be isolated at increased purity.

The two performance characteristics most often used to describe a membrane material are its permeability and its selectivity. A high permeability is necessary to make a membrane process economical: the higher the permeability, the greater the flow of gas that can be processed by a single membrane module, and the lower the pressure drop across the membrane needs to be. A high selectivity is also necessary to make a membrane process useful: the higher the selectivity, the greater the purity of the retentate and the permeate after a single pass through the membrane.

Two classes of membranes currently dominate commercial applications: glassy polymers, which generally have higher selectivities for smaller gasses relative to larger ones, but low overall permeabilities; and rubbery polymers, which generally have higher permeabilities, and can select for larger, more condensable gasses over smaller, less condensable ones.

The permeability of a polymeric membrane is best described by the solution-diffusion model. In this model, gas molecules can pass through the membrane by occupying two idealized environments: The first environment is a dissolved state, where the gas molecules are dissolved in the polymer, similar to the environment of a gas molecule dissolved in a liquid. The second environment consists of "microvoids", regions of otherwise empty space in between polymer strands, which are large enough to accommodate a small gas molecules (such as hydrogen). A polymer with larger and more numerous voids will allow gas molecules to pass through it with a higher diffusivity. The total permeability of the membrane material is the product of the gas diffusivity and solubility, analogous to how the Einstein equation describes the conductivity of a material as the product of its mobility and number of carriers, respectively.

The selectivity of a membrane will depend on the relative diffusivity and solubility of the respective gasses. A glassy polymer will generally not dissolve gas molecules efficiently, and this class is generally efficient at sieving gasses by excluding larger molecules from its microvoids. Such materials can be excellent at separating small molecules, such as hydrogen, from larger ones, such as carbon dioxide.

The selectivity of rubbery polymers is dramatically affected by the solubility of the gasses, because the polymer chains are able to relax to accommodate a soluble gas. Solubility generally increases with the condensability of the gasses, so gasses with high boiling or sublimation points, such as carbon dioxide or methane, will dissolve much more readily than less condensable gasses such as hydrogen or nitrogen. As a result, rubbery membranes can actually pass some larger, more condensable molecules more readily than smaller, less condensable molecules.

For both glassy and rubbery polymers, there is generally a trade-off between permeability and selectivity for a given pair of gasses (for example, nitrogen vs carbon dioxide). In both cases, permeability will increase as the size of the microvoids increase: gas flows with less resistance through larger channels. However, as the void size increases, sieving ability decreases. This trade-off is represented by the well known Robeson plot (FIG. 1), where the log of the permeability is plotted versus the log of the selectivity for one gas versus another. The Robeson plot generally has an upper bound, described by a line, which is in part determined by the solubility performance for a particular group of polymers (for example, polyimides, silicones, etc.) Though this upper bound may shift from group to group, and from gas pair to gas pair, the trade-off has proven consistent across every type of polymer tested.

Since Robeson first described this limitation, it has been the goal of membrane researchers to push their materials above the existing Robeson line. One of the most promising paths of research has been to find new materials that more efficiently dissolve condensable gasses. Such an improvement can improve permeability by increasing the population of one type of gas molecule instantaneously present in the membrane. Selectivity will be improved if the solubility of one type of gas is increased relative to the other(s) in a given mixture.

One approach to improving the solubility of gasses is to switch the membrane material from polymers to liquids, as liquids are able to easily relax their structure to accommodate dissolved species. Furthermore, the diffusivity of gasses through most liquids is high, often as good as the best rubbery polymers. Both traits work towards increasing both permeability and selectivity for a given gas separation, compared with conventional polymeric materials.

In a liquid membrane, selectivity can be dramatically improved by using a strategy called "facilitated transport." In facilitated transport, a carrier molecule dissolved in the liquid can complex one gas component in a mixture, in order to increase its effective solubility relative to the others. The most commonly known example of facilitated transport is hemoglobin, which complexes oxygen to increase its effective solubility in blood. The carrier molecule can be a component of the liquid itself, as has been demonstrated by the use of high temperature molten salts such as $LiNO_3$ to transport oxygen. Facilitated transport is capable of increasing the selectivity for the target gas by two orders of magnitude or more. Such processes are industrially applicable as well: the facilitated transport of propylene relative to propane by silver salts has been demonstrated at the pilot scale.

Another interesting approach towards separations is the "electrochemical membrane separation". In an electrochemical separation, a target molecule in a mixture is oxidized or reduced to a component that is more easily separated from the other gasses in the stream. One example is the removal of hydrogen sulfide from a natural gas stream: The hydrogen sulfide at 600-700° C. is passed through a membrane consisting of a porous cathode and anode, which sandwich a high temperature molten salt embedded in a porous ceramic. During operation, the hydrogen sulfide is converted to hydrogen and elemental sulfur, which is volatile at the temperature of operation.

However, there are three obvious problems with approaches, including facilitated transport and electrochemical separations, that rely on liquids: most liquids are volatile, they are difficult to contain, and liquid films are generally much thicker than comparable polymer materials.

The problems associated with the volatility of liquids has been overcome by the application of liquids which have no appreciable vapor pressure at the temperature of operation. These liquids have included short chain polymers of ethylene glycol, silicones, fluorocarbons, high temperature molten salts, and, most recently, ionic liquids. The improvement obtained by using ionic liquids is plotted in FIG. 1: the ionic liquids shown have better selectivity at a given permeability, relative to all polymers that have been previously tested.

Liquid membranes generally measure tens of microns thick, while the active layers in commercial membranes can be 1000 Å or less. The thickness of the liquids lower the overall efficiency of the membrane, by creating a longer path through which gas molecules must diffuse. As a result, even if a liquid has an inherent permeability (characteristic of the material) an order of magnitude higher than that of a commercial polymer, its performance may be orders of magnitude lower when fabricated into a membrane.

Finally, the difficulty of containing the liquids in a membrane has proven most vexing. The most common approach in academia is to use a "supported liquid membrane", where the liquid is trapped in between two sheets of rigid porous material, or within the pores of a single material. This configuration is not stable under real operating conditions: the constant pressure applied to the membrane results in liquid flowing through the pores, or in tearing of the support layers. Liquids can thus be contained well enough to prove the utility of the approach, but not well enough to enable commercial use.

However, many of these drawbacks are addressed using the nanoparticle liquid composite compositions of the invention. Accordingly, in the present invention, the liquid compositions of the invention find use in membrane applications.

A significant advantage to the nanoparticle liquid composite compositions of the invention is that despite their high liquid loading, composites of non-volatile liquids and nanoparticles behave, on a macroscopic level, more like a solid than a liquid. The non-volatile liquid component exerts a strong capillary pull on the nanoparticles, holding them together in the solid film even without any covalent links. Because nanoparticles inherently have a very high surface to volume ratio, the capillary forces in a nanoparticle-liquid composite are much stronger than those that might constrain a liquid in a traditional porous support material. As a result, the existing problems associated with constraining a liquid in its membrane can be resolved.

As described above, the capillary pressure holding together a liquid composite of 5 nm particles is greater than 10,000 psi. Since membrane separations operate at pressures up to 2000 psi, fluid will not be lost in such an application if a nanoparticle-liquid composite is used as the active membrane material, but a traditional supported liquid membrane will be destroyed.

In addition, as described above, the nanoparticle liquid composites may be spun-cast onto flat substrates in films as low as 500 Å, without pinholes. Films can be regularly made in the submicron regime, compared to films of 10-100 microns for conventional supported liquid membrane systems. Because of this reduction in thickness, membranes prepared from this composite material should have an overall efficiency two or more orders of magnitude greater than previous supported liquid membranes.

The performance of some ionic liquids, such as EMI-dicyanamide, for the separation of carbon dioxide from nitrogen, is already above the Robeson line for existing polymers. Thus, the ability to constrain liquids in extremely thin films may be in itself enough to create an economically viable membrane material. However, there are also several significant benefits of the existing technology that enable it to far surpass currently available technologies. These benefits are outlined below:

Facilitated Transport

A complexing agent that reacts with a specific gas can be dissolved in a non-volatile liquid, and this solution can serve as the liquid component in this invention. For example, Co(salen) complexes have been previously researched in academic labs for facilitated transport of oxygen molecules, with the permeate consisting of oxygen-enriched air. Co(salen) can be dissolved in a non-volatile liquid, and then fabricated into a membrane using the techniques described in this patent, in order to create an oxygen-selective membrane.

For facilitated transport studies, a composite is used with a dissolved transport agent therein. In one embodiment, the dissolved transport agent is silver ions in the form of silver triflate, silver TFSI, silver $PF_6$, etc., which can facilitate the transport of alkenes by binding to them weakly and reversibly. This approach has been widely practiced in the academic literature, and has even been demonstrated at the pilot scale, but has not succeeded in part because of the instability of the confined liquid phase. Silver salts dissolve in a wide variety of ionic liquids, as well as some non-volatile liquid polymers such as poly (ethylene glycol), and can be used as facilitated transport agents in this invention.

Sulfur compounds have also been the subject of facilitated transport studies, as they are major unwanted contaminants of natural gas and refined oils (diesel, naptha, etc.) Removal of hydrogen sulfide from a gas stream was suggested in U.S. Pat. No. 4,115,514, using bicarbonate as the facilitated transport agent and water as the solvent. Other authors have suggested the use of amines such as ethylenediamine as facilitated transport carriers ("Hydrogen Sulfide Facilitated Transport in Perfluorosulfonic Acid Membranes", in Chapter 9 of Liquid Membranes, Theory and Applications, proceedings of the 8th Rocky Mountain Regional Meeting of the American Chemical Society, Jun. 8-12, 1986.)

Other classes of sulfur-containing molecules that can be coordinated and removed by facilitated transport include, but are not limited to: thiols, alkylated thiols, thiophenes, alkylated thiophenes, benzothiophene, alkylated benzothiophenes, dibenzothiophenes, and alkylated dibenzothiophenes, and combinations thereof.

For some embodiments, the dissolved transport agent is part of, or covalently linked to, the non-volatile liquid. For example, the non-volatile liquid itself, rather than a dissolved species, can act as the complexing agent for facilitated transport. For instance, amine-conjugated ILs have been shown in academic work to complex carbon dioxide, and such an IL could be used as a solvent in a facilitated transport membrane.

In most prior work on facilitated transport, the solvent used to dissolve the transport agent was water, as it can be cheaply and easily replenished during membrane use. Because these liquid composites use a non-volatile liquid as their active material, there is not need to replenish the solvent, and solvents with a wide variety of properties divergent from water may be used. This can allow facilitated transport to occur in contexts that have not been previously possible.

In one example, the facilitated transport of water can be accomplished in an otherwise hydrophobic medium. For example, by choosing a hydrophobic ionic liquid such as $BMIM^+BETI^-$ as a solvent, it is possible to create a matrix that is not substantively swelled by water. In such a system, a hydrophillic metal salt such as $Li^+ BETI^-$ can be used as the active transport agent. Other cations, such as Na, K, Rb, Cs, Mg, Ca, etc. and combinations thereof, can also be used as the active transport agent.

Such a system may be applied to systems such as the dehydration of ethanol, which forms an azeotrope with water that cannot be broken by distillation. In this application, it is preferred to use a non-volatile liquid that is immiscible with both ethanol and water. One example that has been cited in the literature is the ionic liquid $BMIM^+PF6^-$ [R. P. Swatloski, A. E. Visser, W. M. Reichert, G. A. Broker, L. M. Farina, J. D. Holbrey, R. D. Rogers, "Solvation of 1-butyl-3-methylimidazolium hexafluorophosphate in aqueous ethanol—a green solution for dissolving "hydrophobic" ionic liquids", Chemical Communications (2001) 2070-2071, herein incorporated by reference in its entirety], though its behavior at room temperature is complex: although it is immiscible with absolute ethanol and with pure water, it is miscible with ethanol/water mixtures, which makes it unsuitable for this application. Moving to more hydrophobic cations such as $OMIM^+$ along with hydrophobic anions such as $TFSI^-$, $BETI^-$, and nonaflate, can reduce the compatibility of the IL with water and ethanol. Such liquids can be "doped" with an active transport agent such as $Li^+$ as LiTFSI or LiBETI. The level of doping should be such that the overall liquid remains immiscible with water and ethanol, but high enough to afford efficient facilitated transport. This membrane can be used in a pervaporation configuration, preferably taking advantage of electroosmotic stirring to increase the rate of transport, as discussed below.

The examples listed above are meant to be illustrative of how facilitated transport can be implemented in a system comprising a non-volatile liquid and nanoparticles, but are in no way meant to limit the possibilities to those specifics. Based on previous studies of facilitated transport, it is expected that such systems can have selectivities that improve over standard materials by two orders of magnitude.

Electroosmotic Flow

The walls of a standard silica capillary are anionic, and except under very acidic conditions, the charge on the walls are balanced by mobile cations (usually sodium). If such a capillary is loaded with electrolyte, and a field is applied across it, the cations move in response to the field, but the silica itself is immobile. This net excess flow of charge towards the cathode drags the rest of the electrolyte solution along with it, producing a net flow termed electroosmotic flow. Electroosmotic flow is used in biology to separate large proteins from one another: smaller proteins flow through the liquid with less resistance than larger proteins, and even anionic proteins are pushed towards the cathode by this flow, despite being driven by the field in the opposite direction.

In this invention, the surfaces of the nanoparticles can play the role of the walls of the capillary, providing a net excess of cations to the non-volatile electrolyte in the composite. Species that are dissolved in the liquid will be transported by the eletroosmotic flow as much as two orders of mangitude faster than they could move by diffusion alone. This improvement in permeability does not involve a trade-off with selectivity— in fact, the selectivity can be improved, as the most soluble species are transported more efficiently than the less soluble species.

In the most straightforward implementation of this invention, an ionic liquid is used as the non-volatile electrolyte for creation of the composite membrane. It may be preferred to reduce the ionic strength of the electrolyte in order to improve the electroosmotic flow, and this can be accomplished by dilution with a second non-volatile liquid, such as a poly (ethylene glycol). Alternatively, a non-volatile liquid doped with a controlled amount of ionic solid (for instance, poly (ethylene glycol) doped with lithium bis(triflamide)) can be used as the electrolyte. Given the high surface area of nanoparticles, it may even be possible to achieve flow without using an exogenous salt.

This technique works in this straightforward manner to boost the efficiency of a facilitated transport system. By combining the two techniques, an improvement of permeability and selectivity of at least two orders of magnitude each is achievable.

The compressor represents the bulkiest and most costly component in a membrane system, and one of the key advantages of the above techniques is that, by increasing the membrane efficiency, the net pressure drop needed to drive the separation can be reduced. Scaling down these compressor systems will allow membranes to become cost-effective in environments where they are currently non competitive.

For electro-osmotic (EO) flow, enhancing transport through a membrane can require configurations that differ significantly from those used to, for example, pump fluids through a capillary tube or microchannel.

In order to allow gas to pass through the electrodes, the electrodes must be porous. Electrodes may be a metal mesh, a porous conductor, or may be patterned directly onto a membrane substrate or support. The electrodes may be metal such as copper, aluminum, nickel, silver, gold, platinum, tungsten, or alloys such as titanium tungsten or stainless steel; they may be conductive oxides such as indium tin oxide, antimony tin oxide, iridium oxide, etc.; they may be metal nitrides such as tantalum nitride or titanium nitride; they may be doped semiconductors such as doped silicon; they may be conductive polymers; or they may be a form of conductive carbon such as graphite.

The rate at which ions will flow towards the electrode depends linearly on the field drop across the electrode. In order to maximize this field drop, in some embodiments it is preferred to make direct contact between the conductive electrode and the composite membrane. In embodiments where an electrochemical reaction is desired, such a configuration is required. If direct contact between the composite liquid and an electrode is established, voltage drops larger than about 4V should be avoided, in order to avoid electrochemical degradation of the membrane material.

In embodiments where no electrochemistry is desired, it may be preferred to coat the electrodes with a dielectric to prevent any oxidation or reduction reactions from occurring in the membrane. This dielectric will result in some loss of field dropped across the membrane. However, such a configuration will allow higher voltages to be applied than without a dielectric, since it prevents direct oxidation or reduction of the composite liquid membrane. By raising the voltage, some of the field that was lost by moving to a coated electrode can be regained.

In some embodiments, it may be preferred to use an asymmetric electrode arrangement. As the ions are attracted to an electrode, they drag the surrounding solvent with an efficacy that is proportional to the charge density on the electrode. Thus, in a system with asymmetric electrodes (one big, one little), a symmetric AC signal will result in an overall flux towards the smaller electrode. This effect can be used advantageously to encourage transport of gas molecules in a single direction, thus increasing the overall flux through the membrane.

It is sometimes preferred to treat the nanoparticle composites with acid or base to modulate the zeta potential of the nanoparticles. For instance, exposure of a liquid composite comprising a 1:1 weight ratio of EMI-Im and IPA-ST nanoparticles (nanoparticle weight, not including the weight of the IPA) results in a gooey paste. Exposure of this paste to vapors from an ammonim hydroxide solution turns this paste into a brittle solid, hinting that the nanoparticles have been deprotinated by ammonia, and have agglomerated into large structures as their zeta potential was shifted. It is worth noting, however, that thick films of such a material remain transparent, indicated that any agglomeration is happening on scales of less than 100 nm or so. By increasing the zeta potential of the particles, it is possible to increase the effectiveness of EO flow.

Electroosmotic Pumping

It is important to note that the thermodynamic force driving the separations is the pressure drop, and that as pressure is reduced, so is the maximum achievable separation ratio. The key parameter determining overall separations efficiency is the partial pressure of the target gas on both sides of the membrane, and once these partial pressures have equilibrated, the flux backwards through the membrane matches the flux forwards. At this point, no further separation takes place. As a result, there is a minimum possible compressor size that is necessary to efficiently drive a given separation, no matter how selective the membrane material. However, for most systems the compressor is scaled well beyond this minimum necessary for high selectivity, in order to deliver high fluxes. Because the cost of a membrane separation scales with the cost of the compressor, reduction of the total compressor size would represent an opportunity for cost savings for a separation process.

Thus, it would be desirable to use an electromotive force in addition to the compressor to augment the pressure drop across the membrane. For applications that only require very small pressure drops, it may be possible to rely on the electromotive force alone. In such a case, the elimination of the compressor entirely would be akin to the replacement of a solenoid with a transistor, and could enable applications in medicine (such as oxygen enrichment of air), space (air recycling), or other industries that require low flux of pure or enriched gasses.

Electroosmotic pumping has been used to generate pressure differences of up to 10 atmospheres using silica microparticles to generate the charge imbalance that drives the system. Because the driving force in electroosmotic flow originates in the ions that comprise the double-layer, it is desirable for the pores of the matrix to be on the order of the size of the double layer: The charges of the double-layer drag the ions and solvent in the electroneutral portion of the channel as they move, and if the ratio of the pore size to double layer is excessive, the pump will be inefficient.

Such a match between double-layer size and pore size has only been previously achieved in a monolithic silica pump created by sol-gel processing [P. Wang, Z. Chen, H-C Chang, "A new electro-osmotic pump based on silica monoliths" Sensors and Actuators B 113 (2006) 500-509]. This silica monolith had pore sizes on the order of a few microns, and efficient pumping could only be achieved by using liquids with very low conductivities and ionic strengths, so that their effective double layer thickness was also above a micron. By fabricating a micropump comprising silica nanoparticles, it is possible to create efficient pumping using conductive liquids, possibly approaching the efficiencies of macro-mechanical pumps. Because the maximum achievable pressure for an electroosmotic pump scales with the square of the pore size of the matrix, pressures much higher than those previously reported should also be achievable.

Thus, by combining known electroosmotic pump configurations with a nanoparticle matrix, it becomes possible to create pressures of several atmospheres even at lower working voltages and shorter channel lengths than in previously described systems. Such an electroosmotic pump could rival a small compressor in performance, but with effectively no moving parts. Furthermore, use of a non-volatile liquid in such a pump would prevent failure of the pump by evaporation of the electrolyte, and allow for a high-reliability, low-cost alternative to macro-mechanical systems.

Electrochemical Separations

A special type of supported liquid membrane that has been described in the literature is an electrochemical membrane. This membrane generally consists of a salt embedded in a porous ceramic substrate, sandwiched by a porous cathode and anode. These systems must be operated at high temperatures, often >400° C., in order to melt the salt into an electrolyte. Work on them has thus focused on separations where the gas stream is already at high temperature, as in coal gasification.

As an example of such a system, a gas stream with a small hydrogen sulfide impurity is passed through an electrochemical membrane with a voltage applied across the electrolyte. The hydrogen sulfide is converted to hydrogen gas and elemental sulfur, which is volatile at the temperature of operation. This type of conversion is particularly important in the coal and gas industries, because the cost of removing hydrogen sulfide by conventional techniques is extremely high.

Similarly, hydrogen chloride in a gas stream can be converted to chloride, hydrogen bromide to bromine, etc.

Because this invention can be made with the non-volatile liquid component comprising an ionic liquid or polymer-based electrolyte, it is possible to operate such a system at comparably lower temperatures (<300° C.) than have previously been reported. The efficiency of such a membrane would be significantly higher than those described in the art, because the difficulty of fabricating salt-in-ceramic membranes has resulted in systems that are hundreds of microns thick.

It may also be possible to combine this approach with facilitated transport, to create a redox mediated facilitated transport system. For instance, the enrichment of oxygen relative to nitrogen in air is considered the "holy grail" of membrane separations, and it has been estimated that a selectivity of 60 or greater would enable membranes to replace cryogenic and pressure-swing gas separations in many applications.

In one example, a membrane can be set up with similar chemistry to a phosphoric acid fuel cell, with two porous platinum (or platinum-coated) electrodes and phosphoric acid as the electrolyte. At the reducing electrode, oxygen can be converted to water and dihydrogen phosphate in phosphoric acid. The water has much higher solubility in the phosphoric acid than either nitrogen or oxygen, and thus permeates across the membrane more rapidly. At the oxidizing electrode, the water can be re-oxidized back to oxygen, with protons absorbed by the dihydrogen phosphate. The resulting membrane will effectively transport oxygen with great selectivity over nitrogen.

In some embodiments, the electrolyte is not pure phosphoric acid, but also contains dihydrogen phosphate. In some embodiments, the feed gas stream has water in it. In some embodiments, the phosphoric acid has a non-volatile co-solvent, such as an ionic liquid. In some embodiments, the phosphoric acid is 85% in water. In some embodiments, the percent content of water is higher than 15%. Other non-volatile liquid inorganic acids, such as sulfuric acid, can also be used in this system. Mixtures of acids, or mixtures of acids with non-acidic, compatible, non-volatile liquids, can also find use in this invention.

Membrane Construction

Because the flux of gas through a membrane depends inversely on the membrane's thickness, it is desirable to construct the active layer of the membrane as thin as possible. For liquid composite membranes, it is preferred to use a thick macroporous support to provide mechanical strength, with a thin active layer of composite coating this support. It is preferred that the composite layer have a thickness of less than a micron, and it is most preferred that the composite layer have a thickness of less than 0.1 microns, although alternate embodiments may utilize thicknesses outside these ranges.

It should be noted that, for very thin liquid composite layers, very small particles can penetrate the layers and negatively impact reliability. In a preferred embodiment of this invention, the composite layer is cast from solution after filtration. The size of the filter must be small enough to filter out harmful particles, but not become clogged with the nanoparticles themselves. For such applications, it is preferred that the particles have a normal distribution (as opposed to log-normal), because this limits the number of truly large particles that might hinder filtration. As a general rule, it is preferred to use a filter size whose pores are at least 10× the mean particle diameter. In a preferred embodiment, particles of an average diameter of 15 nm or less are used, and the solutions are filtered through 0.2 micron pores. In another preferred embodiment, particles of an average diameter of 5 nm or less are used, and the solutions are filtered through 0.1 micron pores. It is also preferred that the filter have little affinity for the nanoparticles themselves (such as complementary ionic character). PTFE filters are one preferred material for such filtering.

The solution may be cast onto the porous support by a variety of methods, including dip coating, spin coating or spray coating. Alternatively, the liquid composite may be applied to the pores inside a porous support by passing a solution of the dissolved composite through the pores of a support, then allowing it to dry in place.

The solvent from which the nanoparticle films are cast will depend on the method of casting and the specific nanoparticles and non-volatile liquids chosen. For dip coating, a low boiling solvent can be preferred. For systems using a cross-linking agent that is tolerant of alcohols (such as a difunctional siloxane), iso-propyl alcohol can be a preferred solvent. For systems using a cross-linking agent that is intolerant of alcohols (such as di-isocyanates), methyl ethyl ketone can be a preferred solvent. For systems that involve coating a porous support by passing a liquid through the pores, a solvent that does not swell (and thus collapse) the pores is preferred.

Screening tests are generally performed using a porous stainless steel disk, 47 mm in diameter, to provide structural support. This disk is mounted into a filter housing (Millipore XX44 047 00), which can withstand pressures up to 300 psi. A 47 mm circle of polysulfone filter paper with a pore size of 0.1-0.2 µm is used as a flexible substrate upon which the active membrane material is coated.

The polysulfone is coated with the composite by any of a number of methods, including, but not limited to: dip coating, spray coating, or simply passing a solution of the composite through the filter paper (samples can be tested using polysulfone filter paper, from Parr) and drying such that the pores become clogged by the composite. The composite can be subsequently cured by heating, UV light, etc., with care taken so that the polysulfone backing is not heated above its Tg, which would collapse its porous structure.

In some embodiments, a gutter material that has high permeability coats the macroporous substrate, in order to give the nanoparticle composite a smooth surface for deposition. In one embodiment, the gutter material is a siloxane. Because the gutter material may limit the overall permeability of the membrane, this is most useful in separations where a high selectivity is important; e.g. facilitated transport.

In one embodiment, the membrane material was prepared from a solution comprising 350 mg EMI-Im, 2 g IPA-ST-S, and 52 mg bis(trimethoxysilylethyl)benzene. In another embodiment, the membrane material was prepared from a solution comprising 300 mg EMI-Im, 2 g IPA-ST-S, and 162 mg dicyclyohexylmethane diisocyanate.

The composite on the polysulfone backing is then attached to the stainless steel disc and sealed into the housing with O-rings. For a static test, a vacuum is pulled on both inlet and outlet sides of the housing, and the outlet valve is closed. A gas or mixture of gasses is introduced on the inlet side at a prescribed pressure, and the inlet valve is closed. The pressure on both the inlet and outlet side are monitored over time as the gas(ses) flow through the membrane and pressure equilibrates. For gas mixtures, a residual gas analyzer can be installed on either inlet or outlet side (or both) to monitor how the gas composition changes as it passes through the filter.

To test the maximum pressure the filter material can withstand, a different Millipore housing (XX45 047 00) can be used. As above, gas pressures can be monitored as a function of time to see if the flow rate changes in a non-uniform manner. A run can be repeated multiple times to determine if the flow rate changes in use.

For evaluating a new liquid composite composition, tests are first made with methane, carbon dioxide, and nitrogen (and mixtures thereof), to determine if the composition behaves as expected. It is preferred to examine separations spiked with water at a level below its dew point, in order to determine if water significantly impacts the separation efficiency.

Other Membrane Applications

As described above, it is also possible to polymerize all, or part, of the ionic liquid and dissolved materials in the pores between nanoparticles. Such a composite system exhibits enhanced performance, whether that be selectivity, permeability, mechanical properties, or some other metric. Such a composite system may also be useful, as, for example, a fuel cell membrane.

As it is possible to selectively remove the ionic liquid from the nanoparticle structural support, it is straightforward to design a membrane that relies on flow through the nanopores for separations. Such a system can be tuned by first selecting the size and shape of the nanoparticles used to form the composite. It can also be further refined by, for instance, narrowing the pore size by coating using a layer-by-layer deposition process such as ALD. Such post-processing can also enhance its mechanical properties, and impart a desired chemical activity to the final product. As described above, similar porosities can be achieved by polymerizing the liquid and removing the nanoparticles. Materials with uniform porosity on the nanometer scale can thus be achieved, with applications in ultrafiltration.

Electrochemical Gas Sensor

An electrochemical gas sensor consists of a simple electrochemical cell, with at a minimum a working electrode, a counter-electrode, and an electrolyte. The electrolyte is usually aqueous and acidic. A voltage is dropped across the working and counter electrodes, and under ideal conditions this will polarize the double-layer, but no further current will flow. However, if a molecule such as hydrogen sulfide migrates to the electrode, it can undergo an oxidation (or reduction) reaction that causes current to flow through the system. This current is proportional to the amount of gas in the ambient environment. As a result, it is possible to translate this current to a detection event, and to estimate the concentration of the gas.

The working electrode is often chosen to be a catalytic metal such as platinum, in order to enhance the rate of electron transfer to the gas molecule. In principle, the voltage can be regulated to target only one particular reaction, but in practice this is difficult, and in this basic cell detection of one gas is easily confounded by the presence of another. In most cases, the molecule of interest is oxidized at the working electrode while a molecule of oxygen, from air, is reduced at the counter electrode. For reduceable molecules, reduction at the working electrode can be countered by oxidation of a sacrificial counter electrode, such as lead oxide.

Gasses that can be detected by electrochemical sensing include, but are not limited to: acetaldehyde, acetylene, acrylonitrile, ammonia, arsine, bromine, butadiene, carbon disulfide, carbon monoxide, carbonyl sulfide, chlorine, chlorine dioxide, dibrane, dimethyl sulfie, epichlorohydrin, ethanol, ethyl mercaptan, ethylene, ethylene oxide, fluorine, formaldehyde, germane, hydrazine, hydrogen, hydrogen bromide, hydrogen chloride, hydrogen cyanide, hydrogen fluoride, hydrogen sulfide, methanol, methyl mercaptan, nitric oxide, nitrogen dioxide, ozone, phosgene, phosphine, silane, sulfur dioxide, tetrahydrothiophene, thiophane, vinyl acetate, and vinyl chloride.

The cell itself must be separated from the environment by a semi-permeable membrane. This membrane must allow the volatile gasses to diffuse into the cell, but it must restrict the diffusion of water from the cell. Such membranes are imperfect, and the cell will tend to swell in size in humid environments, and dry out (to the point of failure) in low humidity environments. This standard configuration also restricts the temperature of operation of the device to a narrow window. The devices also are generally limited in lifetime to two years or less.

This standard configuration also limits the application of the device to novel geometries. For instance, it would be difficult to fabricate such a device in a thin film form factor, most especially because the high surface-volume ratio required of that form factor would allow water to evaporate or condense on the device too easily.

The gelled non-volatile electrolyte of this invention may be used to allow thin-film form factors for an electrochemical sensor. Such a form factor might be advantageous in low-cost sensors, for instance on a semiconductor chip such as an RFID chip. A chip incorporating an electrochemical gas sensor may be advantageous compared to those incorporating semiconductor gas sensors, which usually operate best at elevated temperatures.

As an electrolyte, in a preferred embodiment a film of the present invention incorporating phosphoric acid is used. This phosphoric acid may be used as the sole liquid phase or can be mixed with another non-volatile liquid, such as an ionic liquid. In another embodiment, sulfuric acid is used instead of, or in conjunction with, phosphoric acid.

In one embodiment, a semiconductor chip is fabricated with two metal leads protruding on its surface. The chip is packaged using standard processes that allow the top of the chip to remain available for the deposition of the electrolyte composition. In one embodiment, a plastic package is used, and the chip is wire bonded at its edges to leave the top clear. Electrolyte can then be deposited on top of the protruding wires using a technique such as ink-jetting. A macroporous layer can then be affixed atop the electrolyte composition, in order to protect it from mechanical damage and fouling.

In another embodiment, thru vias are used to make electrical connection to the back of the semiconductor chip. In another embodiment, thru vias are used to make electrical connection to the sensor electrodes, and electrical connection to the chip occurs through top contact (such as bumps).

In another embodiment, the semiconductor chip is an RFID chip. For RFID chips, contact is traditionally made through the top of the chip to the antenna by a conductive adhesive. In one embodiment, the electrode and electrolyte composition are placed next to the areas of contact to the antenna, but thin enough so that they are not disturbed by said contact. In more preferred embodiment, the antenna is fabricated so that it is microporous in the area directly above the electrochemical sensor.

For any of these semiconductor applications, current can be monitored to detect a redox event. This current can be returned directly to the system as an analog signal, or converted to a digital signal for further processing.

Battery Applications

In one embodiment, the compositions of the invention find use in battery compositions (both nanoparticle and polymer liquid composite compositions. In these embodiments, the liquid composite compositions as electrolyte compositions can comprise, for example, lithium salts. This invention is most particularly relevant in the field of thin film batteries, where the need for a low-cost gel electrolyte is most acute.

Gel electrolytes are generally preferable to conventional liquid electrolytes in that there is no risk of electrolyte leakage, and subsequent chemical hazard, should the battery cell be breached. Gelled electrolytes have been used in batteries since the 1920s, when the sulfuric acid electrolyte in lead-acid batteries was gelled using silica nanoparticles. In this case, the addition of sulfuric acid to a 30 weight % dispersion of nanoparticles in water yielded a liquid that could be poured into a battery case, and which would then solidify on standing.

In modern lithium batteries, gelled organic solvents are used in place of liquid electrolytes, primarily to prevent problems associated with solvent leakage. Leakage of the solvent from the battery can result in corrosion or dissolution of materials outside the battery case, and, because of the flammability of organic solvents, represents a significant fire hazard.

Commercially successful gel electrolytes have included poly(ethylene oxide) or poly(vinylidene fluoride-co-hexafluoropropene) (PVDF-HFP), swelled with a conventional organic solvent. Such gels must have good adhesion to the electrode materials (to prevent delamination, as discussed above), maintain good conductivity across a wide temperature range, and have a manufacturing-friendly process for application.

Sony has introduced a battery based on a swelled PVDF-HFP electrolyte, where the gel electrolyte is fabricated as a self-standing film. This electrolyte can thus be wound between the two electrodes, along with a separator, in order to form an elliptical cell.

There are several improvements that a composite of a low-volatility electrolyte with nanoparticles may provide over previously established methods.

The mechanical strength of a nanoparticle composite electrolyte can be made significantly higher than that of a conventional gel. Formulations of nanoparticles and ionic liquids without crosslinking agents can have a modulus of several hundred megapascals, compared to less than a megapascal for a conventional gel. Additives such as crosslinkers in such a formulation can increase the modulus to up to several gigpascals, which compares well to common organic polymers. Such additives can also reduce the brittleness of the films considerably.

This increase in the gel's mechanical strength may allow it to act as both electrolyte and separator in a wound battery or planar thin film battery. A thin film battery architecture that uses a polymer gel electrolyte as a separator has been disclosed in U.S. Pat. No. 7,129,005. The maximum conductivities achievable in that system, however, are considerably lower than those achievable in this invention.

The primary purpose of a separator in a battery is to prevent direct shorting between the cathode and the anode. Conventionally, a thin, porous polymer is used to serve this purpose. This polymer provides the mechanical strength necessary to separate the electrodes, but still allows for flow of the electrolyte through its pores.

It would be desirable to eliminate the separator if possible, as it increases the overall resistivity of the cell (by increasing the cell thickness, and creating a tortuous path for the ions to travel between the electrodes). The cost of the separator, which must be made to exacting specifications for porosity, can also represent a significant fraction of the total materials cost of the battery.

A nanoparticle-electrolyte composite material has pore sizes that are dictated by the size of the nanoparticles and their loading level in the composite. The diffusivity of ions of the ionic liquid EMI-Im through pores in a composite comprising 100 nm particles is only slightly reduced from that of the neat liquid. The conductivity of such a composite, comprising 60 volume % nanoparticles, is roughly 30% that of the neat liquid, in line with expectations from theory for any electrolyte diluted by spherical insulators. (R. E. De La Rue, C. W. Tobiass, "On the Conductivity of Dispersions", Journal of the Electrochemical Society 1959, 106(9), p 827-833) Similar results have been obtained with other ionic liquids, including EMI-OTf, EMI-TCM, BMP-Im, and BMP-OTf, indicating the generality of the result.

This reduction in conductivity compares well with the reductions caused by the separator itself. The thickness of the composite electrolyte film can be less than that of the separator, such that the overall resistance of the electrolyte is reduced. Work with 5 nm particles and ionic liquids show that it is possible to create a composite electrolyte with thicknesses as low as 500 Å. However, for battery applications there must be enough ions to plate on or intercalate into the electrodes for energy storage, yet still maintain conductivity in the electrolyte. The practical limits to thinning the composite electrolyte will thus be set by the specifics of the size of the cathode and anode, and the loading of active ions in the electrolyte.

In one embodiment, the battery electrolyte can be a low-volatility solvent comprising propylene carbonate and/or ethylene carbonate, along with lithium salts such as LiI, LiOTf, LiTFSI, or LiPF6. In another embodiment, the battery electrolyte can comprise low molecular weight poly(ethylene glycols), terminated with methoxy groups to drop their reactivity, along with a dissolved lithium salt as described above. In yet another embodiment, the solvent can comprise ionic liquids and dissolved lithium salts. In another embodiment, mixtures of solvents can be used. In another embodiment, the final material can be mixed with a high-volatility electrolyte such as dimethoxyether as part of the final manufacturing process. Such an electrolyte, comprising a high loading of nanoparticles, may have a lower CTE than conventional electrolyte, which may be useful in constructing batteries that resist failure on thermal runaway.

In an embodiment, the nanoparticles can comprise silica nanoparticles. In a preferred embodiment, the nanoparticles have been synthesized using lithium salts instead of sodium salts, in order to increase the overall lithium content of the electrolyte. In another embodiment, the nanoparticles have been synthesized with sodium counterions, which are later exchanged for lithium.

For a conventional wound battery, composite electrolyte can be applied from solution by a method such as dip coating, spray coating, etc. The electrolyte can be applied to either electrode on the reeled stock, and the carrier solvent removed. The composite electrolyte can be subsequently treated to improve its mechanical properties, using methods including, but not limited to: heating, UV or visible irradiation, or chemical exposure. In some embodiments, the electrolyte is applied to only the cathode or anode. In other embodiments, the electrolyte is applied to both cathode and anode.

In one embodiment, the composite electrolyte is applied by solution to one or both electrodes, such that the composition of the electrolyte has a low enough loading of nanoparticles to render the material tacky after the carrier solvent is removed. The electrodes with or without tacky electrolyte are laminated together, and the electrolyte is subsequently cured to lock in the appropriate materials properties.

In some embodiments, an electrode covered with cured electrolyte is subsequently exposed to a surface treatment step to improve contact with the opposing electrode or coated electrode. This surface treatment step may, in one embodiment, comprise coating with a very thin layer of uncured, tacky composite, as described above. Such composite can be cured into a robust film after winding, assuring that all of the components retain good ionic connectivity In another embodiment, two electrodes can be covered with uncured gels. The surface of both gels are wet with solvent before winding them together, and the stack is subsequently cured to remove the excess solvent and give a robust device.

For a thin film battery, no winding step is used. The composite electrolyte can be deposited on one electrode by solution casting methods, such as dip coating, screen printing, ink jetting, spin-coating, etc. A second electrode can be subsequently laminated to the first by methods similar to those described above. Alternatively, a second electrode can be applied by methods such as direct sputtering onto the composite electrolyte. In some embodiments, it may be preferable to apply the second electrode by spray coating, dip coating, screen printing, spin coating, or ink jetting. A final step may include sealing the cell, to prevent infiltration of moisture or oxygen into the device.

In some applications, it may be preferred to apply the cathode and/or anode as a slurry. For such an application, typically a cathode material comprising cathodic particles, carbon particles, and a binder are mixed with a volatile solvent to form a slurry, and the solvent is removed to cast the cathode onto a substrate. For use with the electrolyte composition of this invention, it may be preferred to add the non-volatile electrolyte to this slurry composition. In some embodiments, it may be preferred to add the solvent composition comprising non-volatile electrolyte and nanoparticles to the slurry. In some embodiments, the nanoparticles in this solvent composition may be electroactive and comprise part or all of the cathode materials.

Once the cathode material has been formed onto a substrate, a solvent composition comprising nanoparticles and a non-volatile electrolyte can be cast on top of the cathode, and the carrier solvent removed to reveal a gel electrolyte with good mechanical properties. This gel electrolyte can function both as the electrolyte and as a spacer than mechanically separates the cathode from the anode.

After formation of the electrolyte layer, an anode may be applied as a slurry, or can be applied by sputtering, or by direct lamination. Finally, the entire system may be capped by a protective layer in order to seal out moisture and oxygen.

The cell may also be built up in reverse, with the anode placed first, directly onto the substrate, and the electrolyte disposed on top of the anode, followed by application of the cathode by methods described above. This description of the formation of a battery is descriptive but is not meant to exclude other possible steps, such as the addition of intermediate steps to improve the adhesion between the electrolyte and one or both electrodes.

In all cases, one advantage of gelled electrolytes is that they possess many of the desirable physical and mechanical properties of polymer electrolytes, but with liquid-like conductivities.

One other advantage of a nanoparticle gelled electrolyte is the opportunity to use lithium metal as the anode material in a lithium battery. Lithium metal is incompatible with conventional gel electrolytes because of its high reactivity, and its tendency to form dendrites through the bulk of the material on cycling, resulting in a shorting failure.

A conventional electrolyte can be loaded with silica by mechanical mixing in order to create a gel electrolyte, and one goal of such work is to suppress dendrite formation. However, because the highest loadings possible by mechanical mixing are only approximately 10%, it is not possible to create a dense enough network of silica to stop dendrite growth. By following the teachings of this invention, however, it is possible to create an electrolyte that can inhibit dendrite formation, thus removing one obstacle to using lithium as a battery anode.

Supercapacitors and Pseudocapacitors

Analogous approaches may provide a supercapacitor instead of a battery, by changing the nature of the two electrodes. For example, as with the approach described above, a supercapacitor may be created by casting gels on and within each of two carbon electrodes. The gels may subsequently be wet with solvent before laminating the two electrodes together, then baked to drive out the solvent and cure the device. Such devices do not show any significant drop in capacitance between the solidified composite electrolytes and a control, where carbon paper was dipped into an aqueous electrolyte. This indicates that the electrolyte is able to penetrate the nano-scale pores of the high surface area carbon electrode, yet still retain its mechanical integrity.

In one approach to a supercapacitor, a spiral-wound module may be formed. In this module, carbon particles act as the electrodes, and they are adhered onto an aluminum current collector. The electrode may subsequently be penetrated with the a composite of nanoparticles and non-volatile electrolyte by solvent casting. Alternatively, the nanoparticle/electrolyte solvent composition may be used in the original slurry that deposited the carbon electrode. A second carbon electrode may be prepared in a similar manner, and the two electrodes are laminated by methods discussed above. This configuration eliminates the need for the separator in the assembly of the capacitor module. In a preferred embodiment, the electrodes are separated by less than 100 microns in order to reduce the total series resistance. In a further preferred embodiment, this electrode-electrode distance is less than 50 microns. In a further preferred embodiment, this electrode-electrode distance is less than 25 microns. In a most preferred embodiment, this electrode-electrode distance is less than 10 microns.

Using the above configuration, it is also possible to create a supercapacitor that operates entirely in the open. Such a device would by necessity operate at lower voltages than a supercapacitor with organic electrolyte, because at high voltages adventitious reactions involving water and oxygen overwhelm the system. But such an open configuration would be lower cost than most alternatives, and may have advantages where flexibility in design is required. It may also be of value for operation in systems that require high temperature operations or which see extreme temperature excursions, as the pressure build-up that limits the performance of conventional hermetic packaging would be eliminated. It may also be of value in systems where the environment is controlled by a secondary package. A system comprising gelled acid, or mixtures of non-volatile liquids comprising acid, may be preferred. Sulfuric acid is one example of an acid that can be gelled by the methods described in this invention.

In another approach to supercapacitors, a pseudocapacitor may be built using the composite electrolyte. In one embodiment, a conducting polymer layer is used as a galvanic charge storage medium on one or both electrodes, in order to increase the total storage density of the device. The conducting polymer may be chosen from any of the classes of conducting organic materials, including polyanilines, polypyrroles, and polythiophenes. Of particular interest are polythiophenes such as PEDOT, which are known to have good stability to electrochemical cycling, and can be processed readily.

In one example, a thin collection layer made of aluminum or another metal is applied to a each of two flexible plastic substrates. If necessary, the back side of these substrates may be treated with aluminum or another material to make them impervious to moisture and oxygen. In some embodiments, the margins of these layers will be kept free of further process steps, so that they are available to seal the device after initial assembly.

On to this collection layer, a lightly doped conducting polymer such as poly(hexylthiophene) or PEDOT is applied by solution casting. On to each of these polymer layers, composite electrolyte is applied. Solvent is applied to one or both electrolyte layers to render their surfaces tacky, and the two layers are pressed together and subsequently cured. The resulting pseudocapacitor strip can then be sealed at its margins using an epoxy chosen to limit moisture and oxygen ingress.

Because both the conducting polymer layer and the electrolyte layer may be formulated to give each good mechanical properties, it becomes possible to build a pseudocapacitor that can be bent without cracking. The assembly process described above is one approach to making such a flexible device, though it is not meant in any way to be limiting. Such a flexible pseudocapacitor can become an important component when coupled with flexible, thin-film batteries and electronics.

One advantage of such devices compared to the current art is their wide temperature range: conductive nanoparticle films (e.g. electrolyte compositions of the invention) have been heated up to 260 C with no loss of conductivity, and mechanical integrity maintained through the entire temperature range. It may be possible to build a supercapacitor or pseudocapacitor that can function in extended temperature ranges, or which can be integrated on a platform (such as a PCB) that experiences high temperatures during fabrication.

Pseudocapacitors involving metal oxides and nitrides are also being investigated for use with non-volatile electrolytes such as ionic liquids. The advantages of this invention may be reasonably applied to these new electrode materials as they are developed.

Finally, the above approaches to energy storage may be combined, for instance by making a cell that is a hybrid battery and supercapacitor. The above descriptions are meant to be illustrative, but not limit the applications of this non-volatile solidified electrolyte to the listed applications or processes.

Electrochromic Devices

In some embodiments, the materials find use in electrochromic devices as solid, transparent electrolytes. The use of ionic liquids in electrochromic devices has been previously described (W. Lu, A. G. Fadeev, B. Qi, E. Smela, B. R. Mattes, J. Ding, G. M. Spinks, J. Mazurkiewicz, D. Zhou, G. G. Wallace, D. R. MacFarlane, S. A. Forsyth, M. Forsyth, "Use of Ionic Liquids for π-Conjugated Polymer Electrochemical Devices", Science 297 (2002) p 983-987). Electrochromic devices based on conducting polymers and ionic liquids have been tested to over $10^6$ cycles in air.

Preparation of an Electrochromic Device Using a Non-Volatile Electrolyte composite proceeds analogously to the preparation of a battery stack. In one example, a cathodically-coloring polymer is prepared on a first ITO-coated transparent substrate, and an anodically-coloring polymer is prepared on a second substrate. A solvent composition comprising a non-volatile electrolyte and nanoparticles is applied to one or both electrodes, and the solvent is removed. The two substrates are then laminated together, possibly with the use of a small amount of additional solvent to wet the surfaces. In some embodiments, the completed device is then cured to improve adhesion. The completed device may be sealed to slow the ingress of moisture or oxygen, though by the teachings of W. Lu et. al., this may not be necessary.

It is also possible to prepare an electrochromic device using dissolved electrochromic molecules, such as viologens or ferrocenes. In such a device, a solvent composition comprising the non-volatile electrolyte, nanoparticles, and the dissolved electroactive molecules is prepared, and it can be applied directly to an ITO-coated transparent substrate. The final device can be cured and sealed before use if desired.

Electrochemical Actuators

Again following the teachings of Lu et. al., electrochemical actuators may be created using the non-volatile electrolyte taught in this invention. In such a device, a pi-conjugated conducting polymer can be electrochemically actuated by moving ions into and out of the bulk of the polymer, thus causing it to expand or contract. The advantage of the electrolyte taught in this invention is that it has greatly improved mechanical properties relative to other gel electrolytes. By using an electrolyte with acceptable mechanical properties, it becomes possible to create a polymer-electrolyte-counter electrode sandwich that operates as a 'dry' device, with no need to constrain the liquid electrolyte.

In one embodiment, a strip that can be actuated is created by coating each of two flexible substrates with a highly conductive polymer such as polyaniline doped with a strong acid such as trifluoromethanesulfonic acid. Alternatively, one electrode is covered with conducting polymer, the other with an inert metal such as gold, preferably roughened in order to increase its surface area. A non-volatile electrolyte composite with nanoparticles is disposed between the two electrodes by the methods taught above for batteries, supercapacitors, and electrochromic devices. The device is cured and sealed if desired.

Dye Sensitized Solar Cells

A dye sensitized solar cell (DSSC), also known as the Gratzel Cell, is an architecture that uses an electrolyte-oxide junction, rather than a p-n junction, to separate photogenerated charge. In a DSSC, light is absorbed by dye molecules that are adsorbed onto the surface of a porous titania layer, and this titania-dye layer is covered with electrolyte containing dissolved oxidizable and reduceable species, such as the iodine/iodide couple. When the light is absorbed an electron-hole pair is created, and the hole migrates into the titania while the electron reduces iodine in the electrolyte to iodide. The iodide can migrate through the electrolyte to a counter-electrode (usually an ITO-coated glass surface), where it can transfer its charge and be reconverted to iodine.

A general problem in the manufacture of DSSCs is the requirement to constrain the electrolyte, to prevent leakage and subsequent cell failure. The liquid electrolyte imposes a significant burden on the packaging of the device. Nanoparticle composites comprising a non-volatile electrolyte and iodide/iodine offer several advantages over the current art, including: physical immobilization of the electrolyte; elimination of the need for a physical spacer to separate the titania from the counter electrode; thinner total electrolyte thickness, which reduces cell resistance from the electrolyte; and the opportunity to sputter the top electrode directly onto the electrolyte.

Liquid Composite Films as a Precursor to Nanoporous Materials

It is also possible to select an etch chemistry such that the non-volatile liquid component of the composition is removed, while the nanoparticle component is left unaffected. In one embodiment, silica is used as the nanoparticles, EMI-Im is used as the non-volatile liquid, and the ratio of nanoparticles to ionic liquid is ≥2:1. Using an appropriate etch chemistry, the refractive index of the composite material can be lowered from 1.5 to 1.3, as the ionic liquid is replaced by void space.

The ionic liquid can be selectively removed by a number of other techniques. If a crosslinker is used to covalently knit the nanoparticles, the ionic liquid can be washed out of the system with a low-boiling solvent, which in turn can be evaporated away. Alternatively, treatment of the nanoparticle composite by a volatile base such as ammonia increases the zeta potential of the silica nanoparticles and drops their solubility, enabling the ionic liquid to be removed without disturbing the silica. A preferred solvent for such an application would be supercritical carbon dioxide, which has no surface tension to prevent its access to the pores containing ionic liquid, and which volatilizes easily as the cleaning chamber is vented to atmosphere.

The ionic liquid can also be removed by heating, either in high vacuum, or in ambient, under which conditions it can either decompose to vapors or evaporate (or both). Pyrolysis of the nanoparticle/non-volatile liquid composite can simultaneously remove the liquid and covalently link the particles, though it is not necessary to complete both processes in a single step.

Such a system also allows for considerable flexibility in the choice of the ionic liquid, and for the use of additives in the non-volatile liquid system, such that crosslinking of the nanoparticles can take place well below pyrolysis temperatures. Further, the non-volatile liquid can be selected from the class of materials that form hydrogen fluoride on decomposition, which, on evolution, can catalyze the cross-linking of nanoparticles.

By the methods described herein, it is also possible to use a polymerizable liquid, which can be activated to form a solid polymeric material with nanoparticulate filler. The nanoparticles can then be selectively etched away, leaving a porous polymer film.

In one embodiment, the polymerizable non-volatile liquid is poly(ethylene glycol) mono-acrylate mono-methyl ether terminated, alone or in combination with poly(ethylene glycol diacrylate), and the nanoparticles are silica. A suitable initiator (thermal or photosensitive) is include with the monomers, and the system is cat into a film and polymerized by triggering the initiator. Once locked down, the composite film is then dipped in hydrofluoric acid (in preferred embodiment, 1% aqueous) and digested until all of the silica has dissolved. The film can then be removed, washed with water to eliminate excess HF, and dried, to present a porous membrane. The volume fraction of nanoparticles used should be optimized to allow for maximum porosity, but still retain mechanical integrity, and will thus vary with the characteristics of the cured polymer. Non-spherical particles such as nanorods can help create a system with long pore channel lengths at lower overall particle loadings.

Any of the above methods will yield a nanoporous material with a relatively homogenous structure. After the initial composite is applied as a thin film, it may be converted into a nanoporous material for use as a low-n coating for optical applications. Such a nanoporous material can be used as a low-k dielectric for electronics application. A membrane of such a nanoporous material, whether freestanding or supported, may be used for separations of liquids or gasses.

Electrolyte Films as a Precursor to Polymer/Nanoparticle Composites

An advantage of this invention is that the nanoparticles are closely packed and homogenously distributed throughout the bulk of the composite material. Once the solvent is evaporated, the material behaves as a solid, and the non-volatile liquid can be acted upon by an external stimulus to cause it to undergo a chemical reaction. Such a process can afford a dense nanoparticle network that is interpenetrated by a new material, which may not be accessible by direct solution casting.

One example of such a process would be to use a polymerizable ionic liquid, such as a vinyl imidazolium cation paired with a compatible anion. This polymerizable ionic liquid can be used alone, or mixed with an inert non-volatile liquid. Other additives, such as initiators or crosslinkers, can be dissolved in the precursor solution at low levels, such that they do not affect the performance of the resulting material. After film formation, polymerization can be initiated by heat, light, radiation, vapor exposure to acid or base, or any other technique familiar in the art.

Another example is to use an oligomeric ethylene glycol, terminated with acrylates or methacrylates, and treated as described above. Such a system may be formulated with or without dissolved salts, depending on the final application.

Such polymer/nanocomposite films have been previously used as fuel cell membranes, or as fire-resistant materials.

Approaches to Low-k Dielectric Materials

In semiconductor manufacturing, in order to isolate individual electrical lines from the fields created by their neighbors, it is necessary to use a low dielectric constant (low-k) material in the intervening space. As manufacturing scales down to the 90 nm node and below, the preferred low-k material, bulk silicon dioxide (k=4.2), no longer has a sufficiently low k to prevent capacitive coupling between adjacent lines or wires. A preferred dielectric material must have a k value lower than 3.0 in order to achieve the integration goals of the semiconductor industry.

One method of reducing the dielectric constant is to create void space in the dielectric film. Because the void space of the film will have a dielectric constant of 1, this will lower the overall dielectric constant of such a porous film.

A common method of creating a porous low-k film is to spin-cast a bulk film that contains a chemical unit called a porogen. A porogen can, for instance, be chemically grafted to a robust low-k material such as a siloxane. Upon heating, or exposure to an electron beam or UV light, the porogens chemically decompose into gaseous material, leaving voids as they escape from the film. Such materials have been successfully tested in the laboratory, but they have not yet shown sufficient mechanical integrity or reliability to qualify for manufacturing.

One of the challenges of this approach is to decompose the porogen without leaving any carbonaceous residues, which will dramatically reduce the critical breakdown field (and thus the reliability) of the dielectric. An advantage of the current invention is that, by selecting an ionic liquid as the porogen, it is possible to remove the ionic liquid without decomposing it.

Ionic liquids have a vanishingly small vapor pressure at room temperature, but their vapor pressure from 200-300 C of many ionic liquids is sufficient to enable their distillation or evaporation. As such, they can be processed as if they were non-volatile, using techniques such as spin-coating. At elevated temperatures, however, they can be cleanly removed, analogous to removing a conventional solvent.

One embodiment of this process is to use an ionic liquid-nanoparticle composite as a precursor film to a low-k dielectric, and removing the ionic liquid by evaporation. There have been several examples in the art that create a porous low-k film using discrete nanoparticles, which are then fused into a continuous, porous material [U.S. Pat. Nos. 5,801,092; 6,218,318; 6,737,107; 6,599,623; 6,440,560]. Many of these approaches suffer from the drawback that they do not use a sacrificial material to fill the voids between particles as the film is cast. As a result, the films are very fragile during the casting process, and prone to defects that arise as the coating solvent is removed.

By contrast, using ionic liquids as a sacrificial porogen allows a continuous film to be deposited by spin-coating, followed by gentle evaporation of the porogen by a bake/vacuum process to reveal a porous structure. If desired, the pores can be treated with a hydrophobic silylating agent to render the interior of the structure hydrophobic. The pores can also be sealed using a low-power sputter process.

In a typical embodiment, a solution of nanoparticles with 33% by weight or less EMI-Im is prepared, and spun onto a silicon wafer. The initial refractive index of the material (which is related to its dielectric constant) is 1.45, but after baking to 260 C on a hot plate, and holding for ten minutes, the refractive index has dropped to 1.29. Holding the temperature at higher temperatures for longer times does not drop the refractive index any further. Baking at lower temperatures for longer times can also be effective at removing the ionic liquid. For such embodiments, it may be preferred to use nanoparticles that are low in sodium content, in order to eliminate unnecessary ions from the final product.

The resulting material has a greatly increased modulus, and can be further processed to increase its mechanical strength, and to improve other characteristics essential for integration.

Other non-volatile liquids, such as oligomeric ethylene glycols, can be substituted for the ionic liquid in the description above to achieve similar results.

Other Applications

In some embodiments, the compositions of the invention can find use as electrolytes to lower the threshold voltage of an organic transistor. In such an application it is favorable to have an electrolyte that can be deposited as a thin, solid film, with an overall CTE that does not differ greatly from many organic solids.

In some embodiments, the compositions of the invention can find use as an impact-absorbing material in lightweight, flexible armor. Compositions of water and nanoparticles, added to a more conventional armor fabric, have shown promise in this regard, as a shock wave causes the nanoparticles to migrate together, and thereby stiffen. Water is ultimately an unsuitable solvent for this application, however, because of its volatility, and an ionic liquid-nanoparticle gel may be designed to perform this function.

EXAMPLES

Example 1

Thick Composite Film

To a colloidal suspension of silica particles (IPA-ST, Nissan Chemical Company of America) in iso-propyl alcohol, ionic liquid is added in an approximately 1:2 weight ratio to silica. In a preferred embodiment, the ionic liquid is ethylmethylimidazolium bis(trifluoromethylsulfonamide) (EMI-Im).

Addition of 1 part by weight EMI-Im to 2 parts by weight silica in a 30 wt % dispersion of 10-15 nm silica particles in IPA results in a clear solution, which can be cast into a Teflon pan. The solvent can be allowed to dry at room temperature, or the system can be heated to 60° C. to facilitate the removal of IPA. The resulting transparent film can be removed from the bottom of the pan with tweezers or a spatula, and handled as a free-standing material.

Addition of significantly less EMI than reported above results in a more brittle material that cracks on drying. Addition of significantly more EMI than reported above results in a paste that cannot be dried to a free-standing film.

The film is thermally stable for extended periods at over 200 C, as shown in FIG. 1.

Example 2

Compatibility Experiments

To a solution of 2 g IPA-ST, as in example 1, is added 300 mg EMI-TCM. A precipitate immediately forms. The formation of the precipitate can be very solvent-dependent, however, as no precipitate forms when DMAc is used as solvent. To illustrate the variety of behaviors, the results of a sample of experiments are summarized in Table 1:

| Cation | Anion | Solvent | Result |
| --- | --- | --- | --- |
| EMI | TFSI | IPA | Clear solution |
| EMI | SCN | IPA | Precipitate |
| BMP | TFSI | IPA | Clear solution |
| BMP | TCM | IPA | Precipitate |
| EMI | OTf | IPA | Precipitate |
| EMI | DCA | IPA | Precipitate |
| EMI | Cl | IPA | Gel |
| Li | TFSI | IPA | Gel |
| BMI | HFP | IPA | Phase separates |
| BMI | Octyl sulfate | IPA | Clear solution |
| EMI | OTF | DMAc | Clear solution |
| EMI | DCA | DMAc | Clear solution |

Example N

Lithium Salt Dissolve in Ionic Liquid

To 1 g of IPA-ST is added 150 mg EMI-TFSI, and the solution is mixed. To this solution is added 22 mg Li-TFSI. No gellation is seen. The solution is cast into a Teflon dish and heated at 80° C. to reveal a transparent film.

Example N

Particles of Different Sizes

To 6 g of IPA-ST-S (3-5 nm particles, 30.5% SiO2 by weight) is added 915 mg EMI-Im. To 6 g of IPA-ST-ZL (100 nm particles, 25% SiO2 by weight) is added 765 mg EMI-Im. Each solution is cast into a Teflon dish and the solvent is removed by gentile heating. For a given volume percentage of silica, the larger particles gave stiffer films than smaller particles.

Example N

Preparation of Material with Voids

A thin film is prepared as in Example 2 has a refractive index of 1.446 at 550 nm and a thickness of 307 nm (by ellipsometry). Heating this film at 250° C. for 2 hours drops the refractive index to 1.303, and drops the thickness to 278 nm. This temperature is below the decomposition temperature for EMI-Im, and as a result one can infer that the IL evaporated during the heating process. Further heating this sample at 400° C. overnight does not change the thickness, but drops the refractive index to 1.293. This value of refractive index is approximately what one would expect for a silica material with about ⅓ void fraction.

Example N

Film with Al2O3

To 1 g dispersion of Al2O3 in PGMEA (NanoArc R1130PMA, with dispersant) is added 1 g of PGMEA and 110 mg EMI-SbF6. The solution is poured into a Teflon dish and the solvent is removed by gentle heating. A sturdy film results, and the film is translucent owing to relatively close match of the refractive indeces of the IL and the nanoparticles.

A similar formulation with 158 mg EMI-SbF6 yields a sticky film rather than a sturdy one. These films have low overall IL loading, which is in part because the distribution of particles in the dispersions are log-normal. In a log-normal system, smaller particles will be able to migrate to the void spaces between larger particles, forcing out IL. As a result, these films become sturdy at much lower particle loadings.

Example 2

Thin Composite Film

To a colloidal suspension of silica particles (pH=2-4) in organic solvent, ionic liquid is added in an approximately 1:2 weight ratio to silica. In a preferred embodiment, the ionic liquid is ethylmethylimidazolium bis(trifluoromethylsulfonamide) (EMI-Im).

Addition of 1 part by weight EMI-Im to 2 parts by weight silica in a 30 wt % dispersion of 10-15 nm silica particles in PGMEA results in a clear solution. To each gram of this stock solution is added 1.077 g of PGMEA. The solution is mixed by stirring.

The solution can be spun between 1500 and 8000 rpm onto a 2" silicon wafer. At 4000 rpm, this film gives an approximately 2500 Å thick film. The stock solution itself can be spun as low as 1500 rpm to give a film up to 1.2 um in thickness.

Figure 2:
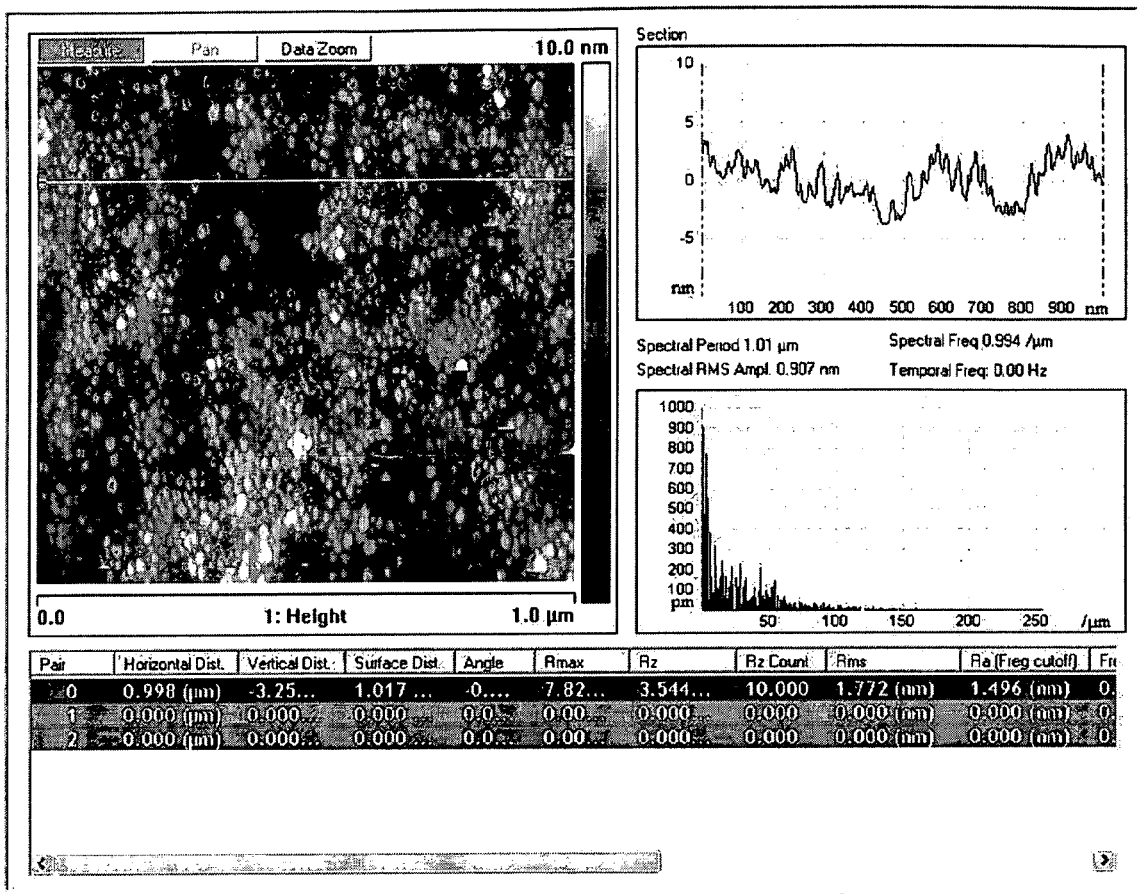
FIG. 2 AFM of a spun-cast film of silica nanoparticle and EMI-Im from PGMEA.

The films are extremely uniform by ellipsometry, and show an rms roughness of <2 nm by AFM. Individual silica particles can be resolved by AFM, and are tightly packed, though not ordered (FIG. 2). The conductivity of a film that is 33 wt % EMI-Im is roughly 1 µS/cm. The conductivity of a film that is 37 wt % EMI-Im is roughly 1.7 µS/cm.

Example 3

Thick Film Using Crosslinking Agent

To a colloidal suspension of silica particles (pH=2-4) in PGMEA (2 g) is added EMI-Im (300 mg) and dicyclohexylmethane diisocyanate (0 mg, 16 mg, or 161 mg) as a crosslinking agent. The solution is mixed until homogenous, and spun onto a comb structure to a thickness of about 1 micron, then baked at 90° C. for 3 minutes and 140° C. for 1 hour.

The conductivity is measured by AC impedence spectroscopy, and the modulus is measured by dynamic nanoindentation. In the case with no added crosslinker, the conductivity is 1.07 mS/cm, and the modulus is approximately 700 MPa, though because of the type of measurement, this may represent an upper bound. In the case with only 16 mg crosslinker, the conductivity drops slightly to 0.85 mS/cm, and the modulus increases to about 2 GPa. In the case with 161 mg crosslinker, the conductivity drops further to 0.39 mS/cm, and the modulus increases to over 4 GPa.

Similar results can be obtained using other crosslinking agents, such as bis(trimethoxysilylethyl)benzene.

Example 4

Films Using Silicon Dioxide Nanorods

To a colloidal suspension of silica nanorods (pH=2-4) in organic solvent, ionic liquid is added in an approximately 1:1 weight ratio to silica. In a preferred embodiment, the ionic liquid is ethylmethylimidazolium bis(trifluoromethylsulfonamide) (EMI-Im). Addition of 1 part by weight EMI-Im to 1 part by weight silica in a 15 wt % dispersion of 10-15 nm diameter silica rods in IPA results in a clear solution.

The solution is transferred to a Teflon pan and heated to 7° C. to facilitate the removal of IPA. The resulting film can be removed from the bottom of the pan with tweezers or a spatula, and handled as a free-standing material.

A thin film can be made by spin-casting from the above solution. Spinning at 4000 rpm affords a 1.7 µm thick film that fractures when scratched. The conductivity of such a film is roughly 3 mS/cm.

A thick film comprising both nanoparticles and nanorods can be prepared by mixing the desired ratio of nanoparticle and nanorod solutions in IPA, along with EMI-Im, then transferring to a Teflon pan and heating to remove the solvent.

Example 5

Film Containing an Ionic Liquid and an Added Salt

To a colloidal suspension of silica particles (pH=2-4) in organic solvent, ionic liquid is added in an approximately 1:2 weight ratio to silica. In a preferred embodiment, the ionic liquid is ethylmethylimidazolium bis(trifluoromethylsulfonamide) (EMI-Im). Addition of 1 part by weight EMI-Im to 2 parts by weight silica in a 30 wt % dispersion of 10-15 nm silica particles in IPA results in a clear solution. Further addition of 5% by weight Li-Im results in no change to the solution.

The final solution can be cast into a Teflon pan. The solvent can be allowed to dry at room temperature, or the system can be heated to 6° C. to facilitate the removal of IPA. The resulting material is transparent and can be removed with tweezers as a free-standing film.

Example 6

Film Using Phosphoric Acid as a Non-Volatile Liquid

To 2.0 g of a colloidal suspension of silica particles (pH=2-4) 30% by weight in isopropyl alcohol is added 246 mg phosphoric acid (85%). The solution is poured into a Teflon dish and the IPA is evaporated with gentle heating at 80° C. to reveal a transparent, brittle solid composite film Example 7

Film Using poly(ethylene glycol) as the Non-Volatile Liquid

To 2 g of 30% silica colloid in ethylene glycol mono-propyl ether is added 197 mg of PEG (MW=300) and 97 mg LiTFSI. The solution is mixed until homogenous and poured into a Teflon dish. The dish is heated on a hot plate at 80° C. for 4 hours, then at 140° C. for 3 hours, to reveal thick transparent films.

Addition of the PEG and lithium salt to a silica colloid in IPA results in gelling of the solvent.

Example 8

Film Using Propylene Carbonate as the Non-Volatile Liquid

To 6 g of IPA-ST (30% silica sol in IPA) is added 900 mg of 1 M LiOTf in propylene carbonate. The solution is cast into a Teflon plate and heated on a 70° C. hot plate for 2 hours until the IPA has evaporated, leaving 2.42 g of electrolyte composite.

This composite can be handled as a solid and redissolved in other solvent, such as a low-boiling solvent, in order to make an liquid electrolyte composition that is high in silica content.

Example 9

Composite of ITO and Ionic Liquid

To 1 g of a dispersion of ITO in MEK (Air Products) is added 22 mg EMI-Im. The solution is cast as a thick film onto a glass slide and baked at 200° C. for 30 minutes. Two probes were placed into the film approximately 1 cm apart, and current was monitored as a voltage was applied across the electrodes. Initial currents were high, consistent with ion movement towards the electrolyte, followed by low currents characteristic of 1 GOhm DC leakage. Reversal of the voltage shows similarly consistent behavior. This experiment demonstrates the potential to get both ion and electron mobility in a composite system.

Example 10

Electrolyte Films as Substrates for Vacuum-Phase Deposition

Figure 3:
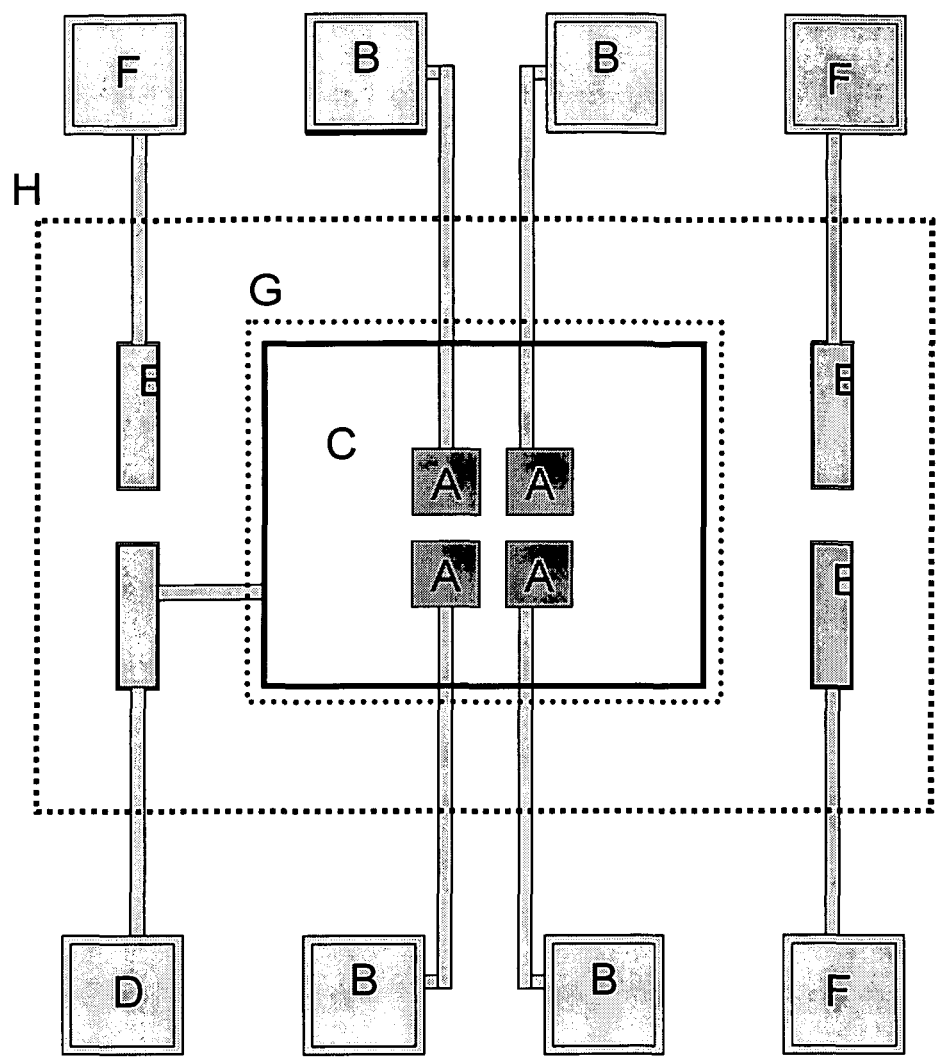
FIG. 3 Layout of test structure used for electrical interrogation of nanoparticle/ionic liquid films.

A film of a nanocomposite of EMI-Im and 10-15 nm silica nanoparticles (from Example 2) is spun-cast from PGMEA onto a test structure, shown in FIG. 3. The test structure has been prepared by conventional semiconductor processes and lithographic techniques. The structure contains 4 titanium nitride electrodes (A) which are electrically connected to 4 separate aluminum bond pads (B). The electrodes are in proximity to, but physically and electrically separated from, a large titanium nitride trough (C), which is electrically connected to a single bond pad (D). In addition, there are 3 aluminum tie-down structures (E) physically removed from the trough, and each tie-down structure is connected to its own bond pad (F). The insulating areas between each of the structures are silicon dioxide.

A wafer piece containing this test structure and a nanocomposite film between 900 and 10000 A thick is affixed to a shadow mask, which obscures all the active regions except for the working electrodes (A) and the trough (C) (dotted line G).

The assembly is placed into high vacuum, and a conductive material is sputtered directly onto the nanocomposite film, preferably to a thickness of 1000 A. The conductive material can be chosen from the whole range of metals, metal oxides, metal nitrides, etc., but is preferably copper or titanium.

This system can be probed directly, by affixing one metal probe to a bond pad (B) connected to a titanium nitride electrode (A), and a second probe directly to the deposited metal. In such a configuration, the capacitance is similar to what is seen using a liquid electrolyte with electrode (A), indicating that an acceptable electrical connection has been made between the metal and the electrolyte.

Figure 4:
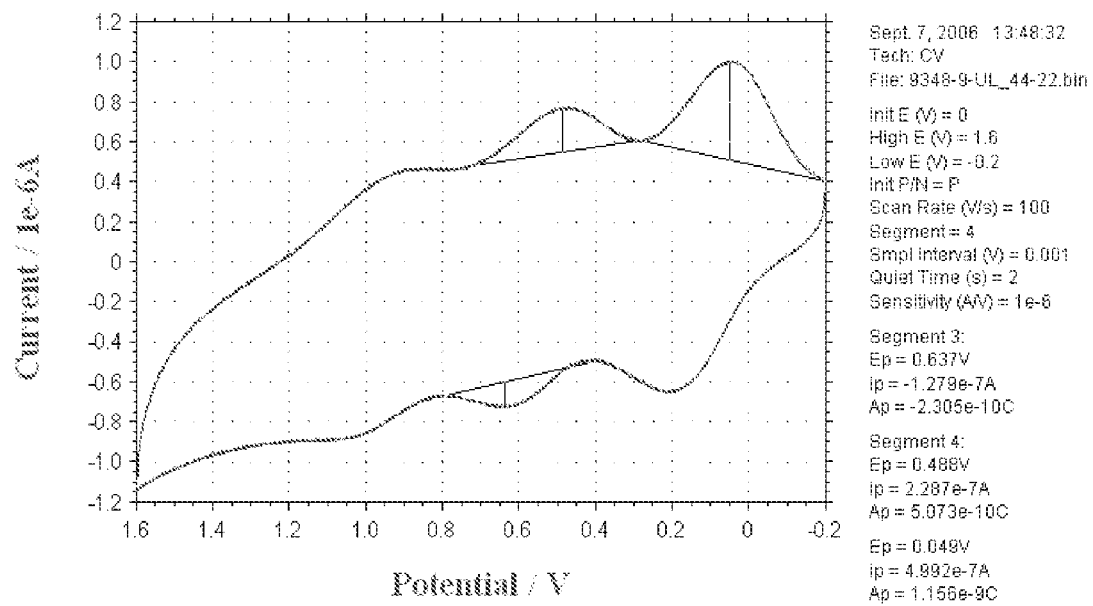
FIG. 4: CV of ferrocene-appended porphyrin monolayer, using silica/IL nanocomposite as the electrolyte, and sputter-deposited copper as the counter-electrode. The peak close to 0V is from ferrocene oxidation; the other two peaks represent porphyrin oxidation.

To demonstrate that such a system can be used as an electrochemical cell, a monolayer of redox-active molecules, such as porphyrins or ferrocenes, can be prepared on the electrode (A) prior to forming the thin nanocomposite film. Using electrode (A) as the working electrode and the sputtered metal as the counter electrode, a current-voltage sweep reveals the oxidation and reduction waves that are specific to porphyrin and ferrocene molecules (FIG. 4). For some embodiments of the system, the oxidation and reduction waves display no peak splitting due to the internal resistance of the cell for sweep rates up to and above 1000 V/s. Such a result can only be obtained by using a thin electrolyte film of high conductivity, with a favorable interface between the electrolyte and the top electrode.

For use in a device, the nanoparticle electrolyte can be processed to create a sealed electrochemical cell. In the embodiment described above, the deposited metal can act as a hard mask, allowing the nanocomposite film to be etched in the regions not covered by metal. The wafer can then be affixed to a second shadow mask that opens only the trough, working electrode, and tie-down structures (dotted line H). Metal deposited over the open regions both encapsulates the working electrodes, and electrically connects the top metal to the tie-downs (E) and their bond pads (F). The system can thus be probed by using the bond pad (B) to connect to the working electrode, and the bond pad (D) to connect to the top metal counter electrode.

Because of the low ionic liquid loading, the CTE of the encapsulated region can be kept below 100 ppm. Such a system can be heated to temperatures of 160 C or greater without damage to the encapsulated cell.

It should be noted that, although a depositing a conductive material on top of the electrolyte is critical for some applications, the electrolyte may serve as a substrate for the deposition of an insulator as well. Such a top coating may be useful to hermetically seal an electrolyte structure, for example.

Example 11

Liquid Composite as a Supercapacitor Electrolyte

The solvent composition of 1.05 g EMI-Im in 6 g IPA-ST is drop-cast onto two 1 in$^2$ pieces of Spectracarb 2050-A-6060. The IPA was allowed to evaporate with gentle heating, and another layer of composite is deposited by drop-casting. The IPA was again allowed to evaporate from the bulk, and then each surface was wetted with a small amount of pure IPA, and the two pieces were pushed together to unite the electrolyte and form the supercapacitor. The entire system was heated at 140° C. to drive off residual IPA. The resulting stack consisted of two pieces of carbon paper separated by several hundred microns of solid electrolyte, with no need for containment.

The supercapacitor was tested by sweeping from +0.5V to −0.5V at 10 V/s and measuring the resulting hysteresis (capacitance). For comparison, two spectracarb sheets held in aqueous electrolyte were also tested. No difference in capacitance between test and control was seen, indicating the ionic liquid in this system penetrated the pores of the carbon paper.

Example 12

Liquid Composite Using Ethylene Glycol Crosslinking Agent

To 1.66 g of IPA-ST is added 350 mg of EMI-Im and 100 mg of poky(ethylene glycol) dimethacrylate (Mn=330, Aldrich). The solution is poured into a Teflon dish and baked on a hot plate at 70° C. for one hour to remove the IPA solvent, then at 140° C. for one hour to start polymerization. The dish was then transferred to a 150° C. for four hours to complete the polymerization. The final material is a transparent amber film with significantly improved modulus.

By replacing the IPA-ST with PMA-ST, a solution can be prepared that is amenable to spin coating. A 1.9 micron film of the above composition, heated on a 140° C. hot plate for 30 minutes to cure, displayed a conductivity of about 2 mS/cm.

Example 13

Liquid Composite Using Ethylene Glycol Crosslinking Agent

To 400 mg of sulfuric acid is added 3 g of DMAC-ST. The solution is mixed and poured into a Teflon dish, which is place on a 100° C. hot plate overnight to allow the DMAc solvent to evaporate. The resulting material is a thick, free-standing film. Conductivity measurements of a 1 micron film spun-coat onto a platinum comb structure indicate the conductivity of the film is about 5 mS/cm, within the range of expectations for neat sulfuric acid diluted by inert particles.

What is claimed is:

1. A solvent composition comprising:
   a) an organic solvent;
   b) nanoparticles, said nanoparticles each having at least one dimension less than 25 nm and being dispersed individually in the solvent composition; and
   c) a non-volatile electrolyte
   wherein the nanoparticles have a surface that prevents substantial aggregation of the nanoparticles in the presence of the non-volatile electrolyte, and the solvent composition contains at least 20 wt. % of the dispersed nanoparticles.

2. A composition according to claim 1 wherein said non-volatile electrolyte comprises an ionic liquid.

3. A composition according to claim 1 wherein non-volatile electrolyte comprises a poly(glycol).

4. A composition according to claim 1 wherein said organic solvent is a polar organic solvent.

5. A composition according to claim 1 wherein said nanoparticles have a surface with a pH of below 7 when in water.

6. A composition according to claim 1, wherein said nanoparticles comprise acidic silicon dioxide.

7. A composition according to claim 1, wherein said nanoparticles comprise a core and a shell, and said shell comprises silicon dioxide.

8. A composition according to claim 7, wherein said core is a material different from the shell.

9. A composition according to claim 1 further comprising at least one reactive agent.

10. A composition according to claim 9 wherein said reactive agent is a crosslinking agent.

11. A composition according to claim 9 wherein said reactive agent is a monomer.

12. The composition according to claim 1 wherein at least some of the organic solvent is removed to form an electrolyte composition.

13. The electrolyte composition according to claim 12 wherein the composition is a single phase liquid or homogeneous gel.

14. The composition according to claim 13 wherein the single phase liquid or homogeneous gel contains at least about 40 wt. % of the dispersed nanoparticles.

15. A composition according to claim 1, wherein said nanoparticles have at least one dimension in the range of 10 - 15 nm.

* * * * *